(12) United States Patent
Shanan

(10) Patent No.: US 8,049,540 B2
(45) Date of Patent: Nov. 1, 2011

(54) CALIBRATION SYSTEM AND METHOD FOR PHASE-LOCKED LOOPS

(75) Inventor: Hyman Shanan, Douglas (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/563,757

(22) Filed: Sep. 21, 2009

(65) Prior Publication Data

US 2010/0171535 A1 Jul. 8, 2010

Related U.S. Application Data

(60) Provisional application No. 61/192,545, filed on Sep. 19, 2008.

(51) Int. Cl.
  *H03L 7/06* (2006.01)
(52) U.S. Cl. ........................ 327/157; 327/148
(58) Field of Classification Search .............. 327/148, 327/157
See application file for complete search history.

(56) References Cited

U.S. PATENT DOCUMENTS

| | | | |
|---|---|---|---|
| 6,359,950 B2 * | 3/2002 | Gossmann et al. ........... 375/376 |
| 6,670,861 B1 | 12/2003 | Balboni | |
| 6,731,145 B1 | 5/2004 | Humphreys et al. | |
| 6,806,780 B2 | 10/2004 | Fontaine et al. | |
| 6,828,864 B2 * | 12/2004 | Maxim et al. ................... 331/17 |
| 6,834,183 B2 | 12/2004 | Black et al. | |
| 6,998,923 B2 * | 2/2006 | Melanson ....................... 331/17 |
| 7,110,486 B2 * | 9/2006 | Adachi et al. ................. 375/376 |
| 7,259,633 B2 * | 8/2007 | Lee et al. ......................... 331/16 |
| 7,301,405 B2 | 11/2007 | Kawabe et al. | |
| 7,352,249 B2 * | 4/2008 | Balboni et al. .................. 331/16 |
| 7,352,250 B2 | 4/2008 | Akamine et al. | |
| 7,486,118 B2 * | 2/2009 | Chen et al. ..................... 327/156 |
| 7,583,774 B2 * | 9/2009 | Lesso ............................. 375/377 |
| 7,602,252 B2 * | 10/2009 | Sakai ............................. 331/1 A |
| 7,764,094 B1 * | 7/2010 | Arora ............................. 327/157 |
| 7,772,930 B2 * | 8/2010 | Gatta ............................... 331/16 |
| 2006/0056561 A1 * | 3/2006 | Zhang ........................... 375/376 |
| 2007/0085579 A1 * | 4/2007 | Wallberg et al. .............. 327/156 |
| 2007/0109067 A1 | 5/2007 | O'Sullivan et al. | |
| 2008/0164918 A1 * | 7/2008 | Stockstad et al. .............. 327/157 |
| 2008/0272811 A1 * | 11/2008 | Chen et al. ..................... 327/157 |
| 2010/0020912 A1 * | 1/2010 | Lesso ............................. 375/376 |
| 2010/0171535 A1 * | 7/2010 | Shanan ........................... 327/157 |

OTHER PUBLICATIONS

McMahill, Daniel et al, "Automatic Calibration of Modulated Frequency Synthesizers," *IEEE Transactions on Circuits and Systems II*, May 2002.

Shanan, Hyman, et al, "A 2.4GHz 2Mb/s Versatile PLL-Based Transmitter Using Digital Pre-Emphasis and Auto Calibration in 0.18μm CMOS for WPAN," 2009 IEEE International Solid-State Circuits Conference, Session 24, pp. 420-422.

* cited by examiner

*Primary Examiner* — Lincoln Donovan
*Assistant Examiner* — Adam Houston
(74) *Attorney, Agent, or Firm* — Knobbe, Martens, Olson & Bear, LLP

(57) ABSTRACT

A method for calibrating a bandwidth of a phase-locked loop begins with detecting an error signal generated by the phase-locked loop in response to a stimulus signal. The difference between the integral of the error signal and a nominal value thereof is computed, and the bandwidth of the phase-locked loop is adjusted based on the computed difference.

8 Claims, 20 Drawing Sheets

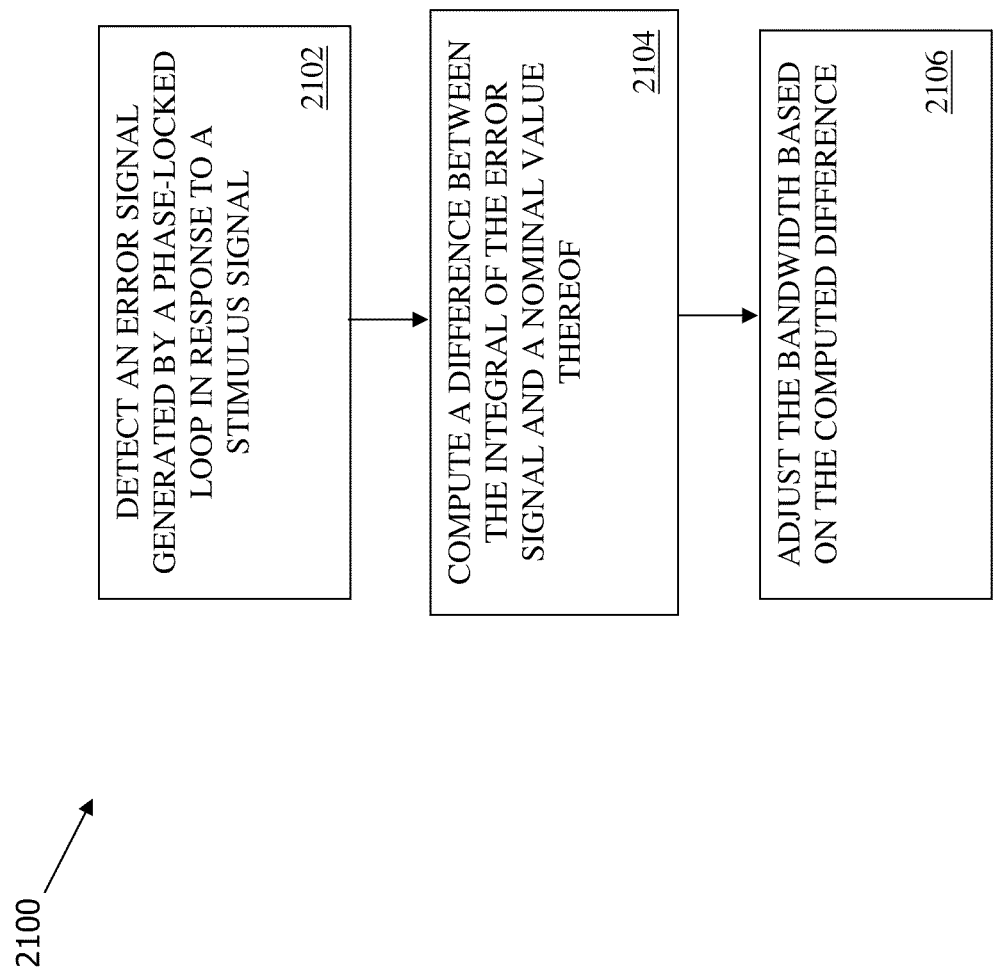

CALIBRATION SYSTEM AND METHOD FOR PHASE-LOCKED LOOPS

CROSS-REFERENCE TO RELATED APPLICATIONS

This application claims priority to and the benefit of U.S. Provisional Patent Application Ser. No. 61/192,545, filed on Sep. 19, 2008, which is incorporated herein by reference in its entirety.

FIELD OF THE INVENTION

Embodiments of the invention relate to calibration methods and systems for phase-locked loops, and, in particular, to detection and compensation of bandwidth variation in phase-locked loops.

BACKGROUND

Phase-locked loops (PLLs) are used in a variety of applications, such as clock and data-recovery circuits, clock-generation circuits, and communication circuits. Implemented as frequency synthesizers, PLLs may be used to transmit and receive data in wireless communication transceivers, which may be used in wireless sensor networks, point-to-point data links, wireless local area networks (WLANs), WiMax applications, mobile phones, and data streaming applications.

The design of wireless communication transceivers may be difficult, however, due to a large number of practical and regulatory constraints. For example, wireless sensor network transceivers may operate in the industrial, scientific, and medical (ISM) band (at, e.g., 900 MHz or 2.4 GHz), which is regulated by various communication standards such as the emerging IEEE 802.15.4, SP100, and/or WirelessHART standards. Transceivers in wireless sensor networks may require ultra-low power consumption per unit (e.g., less than 25 mW in transmit mode), low selling price per unit (e.g., less than $1), and increasingly higher levels of integration of the digital-signal processing functions. Wireless sensor networks using Direct Sequence Spread Spectrum (DSSS) modulation, high-quality audio and video streaming applications, and other data-intensive applications require high rates of data transmission—for example, 2-4 Mbps. These high data rates may need a low modulation error rate (MER) or, equivalently, a low error-vector magnitude (EVM) and high signal-to-noise ratio (SNR) at the transmitter output to preserve the modulation accuracy.

Traditionally, cartesian RF modulators have been used to transmit high-data-rate signals; this type of modulator, however, depends heavily on analog circuitry. Analog circuit imperfections, such as quadrature-phase and gain mismatches, single-side band suppression, and direct LO feedthrough considerably impair the modulation accuracy of cartesian-based transmitters. Cartesian RF modulators also require, in addition to a frequency synthesizer, two channels of digital-to-analog converters (DACs), low-pass filters, and RF mixers with inductive loads. These circuits are expensive both in terms of silicon area and power consumption.

An alternative approach uses a frequency-synthesizer-based transmitter to mitigate some of the drawbacks associated with cartesian RF modulators. Traditional frequency-synthesizer-based transmitters, however, suffer from an inherent trade-off between MER and spectral emissions, thereby limiting their maximum data rate. One possible solution is to extend the bandwidth of the (primarily analog) frequency-synthesizer-based transmitter using digital pre-emphasis techniques, thereby improving its MER at high data rates as well as reduce its spectral emissions. The transfer function of the analog-based frequency synthesizer, however, may vary with process tolerances and temperature variations, while the digital circuitry may have a constant, invariable transfer function. This difference in behavior may create a mismatch between the analog transfer function of the frequency synthesizer and the digital transfer function used for pre-emphasis. This mismatch may cause the cascaded (i.e., analog plus digital) bandwidth of the frequency synthesizer to significantly deviate from the target bandwidth as operating and process conditions change. It is crucial, however, to maintain the accuracy of the match between the digital and analog transfer functions to guarantee a minimal (e.g., less than ±10%) variation of the cascaded bandwidth of the frequency synthesizer transfer function.

Various schemes to calibrate the bandwidth of a frequency synthesizer exist. One such scheme is based on locking the frequency synthesizer at two different frequencies separated by a known difference ($\Delta f_{cal}$) and measuring the difference between the loop-filter tuning voltages ($\Delta V_{cal}$) at each frequency. Using the value of $\Delta f_{cal}/\Delta V_{cal}$, the gain of a voltage-controlled oscillator (VCO) may be estimated and its variation from the nominal value may be derived. This scheme uses either a high-resolution analog-to-digital converter (ADC) to directly measure the loop-filter tuning voltage or an amplifier circuit to measure $\Delta V_{cal}$ and an ADC to digitize the measurement. The digitized output of the ADC is then used to address a look-up table (LUT) to obtain the calibrated charge-pump current of the frequency synthesizer. Increasing (or decreasing) the charge-pump current causes the bandwidth of the frequency synthesizer to increase (or decrease).

This scheme, however, has two main shortcomings. First, components other than the VCO gain variation may affect the bandwidth variation of the frequency synthesizer but are not accounted for. For example, the characteristics of the loop filter and/or the charge pump may significantly vary with process conditions and temperature, but the differences would not be calibrated. Second, a high-resolution ADC and a high-accuracy difference amplifier each consume a large amount of silicon area, thereby increasing cost, complexity, and/or power consumption.

A second scheme for closed-loop bandwidth calibration of a PLL-based frequency synthesizer calibrates the variations of all the individual contributors to the overall variation of the bandwidth. This second scheme, however, also suffers from two major drawbacks. First, it requires an additional calibration port at the VCO input during calibration. Although the additional calibration port may be also used for modulation, in the case where a pre-emphasis filter is used, extra circuitry is required for the second port. In addition, the closed-loop calibration circuitry will introduce errors once it is removed after calibration. Second, the preferred method of calibration in this scheme is through the VCO amplitude control, which controls the VCO gain. The variation in bandwidth, however, may be excessive, and absorbing a large variation in the VCO gain poses significant stability and linearity issues in the closed-loop response of the frequency synthesizer.

Given the above shortcomings of existing calibration systems, a need exists for a simple, area- and power-efficient, accurate, and comprehensive calibration system and method for PLLs and, in particular, PLL-based frequency synthesizers.

SUMMARY

Embodiments of the present invention include systems and methods for calibrating a bandwidth of a PLL or frequency synthesizer by detecting an error signal generated in response to a stimulus signal, integrating the error signal, comparing the integrated error signal to a nominal value thereof, and modifying a component of the frequency synthesizer in response. As explained further below, the error signal provides an indication of if and how far the frequency synthesizer bandwidth has drifted away from a nominal bandwidth. Detection and use of the error signal provides a fast, accurate, and low-power method to calibrate a frequency synthesizer.

In general, in one aspect, a method for calibrating a bandwidth of a PLL begins with detecting an error signal generated by the PLL in response to a stimulus signal. The difference between the integral of the error signal and a nominal value thereof is computed, and the bandwidth of the PLL is adjusted based on the computed difference.

In one embodiment, the nominal value of the integral of the error signal corresponds to a nominal bandwidth of the PLL. Detecting the error signal may include sensing a signal in the PLL and converting the sensed signal to one of a voltage or a current. Computing the difference may include amplifying the integrated error signal to increase the accuracy of the computed difference. The error signal and/or the integrated error signal may be digitized and/or integrated, and the computed difference may be curve-fit to produce a calibration signal. Adjusting the bandwidth of the PLL may include modifying a component (e.g., a charge pump, a loop filter, a voltage-controlled oscillator, and/or a voltage-controlled oscillator frequency divider) of the PLL based on the calibration signal. The PLL may be used in a frequency synthesizer, RF modulator, wireless communication transceiver, clock generation circuit, data recovery circuit, and/or clock recovery circuit. The steps included in the method for calibrating may be performed of the method at periodic intervals. The stimulus signal may be a frequency step.

The calibration method may further include identifying an inaccuracy in the detected error signal and reducing the inaccuracy (e.g., modifying a calibration circuit component and/or subtracting the inaccuracy from the integrated error signal). The inaccuracy may include a current mismatch between a calibration charge pump and a PLL charge pump, and the current mismatch may include a deviation from a substantially zero value of an average output of the calibration charge pump. The deviation from zero may be measured after the PLL has been locked for a predetermined amount of time. Computing the integrated error signal may include measuring a signal on an integration capacitor.

The calibration method may further include determining a capacitance of the integration capacitor and adjusting the capacitance of the integration capacitor to a predetermined value (e.g., a value that corresponds to the integration capacitor value in the absence of process variations). Adjusting the capacitance of the integration capacitor may include enabling at least one of a plurality of selectable capacitors. Determining the capacitance of the integration capacitor may include measuring a slope of a voltage on the integration capacitor and comparing the measured slope to a nominal slope. The voltage on the integration capacitor may change in response to an applied time-varying signal.

In general, in another aspect, embodiments of the invention include a system for calibrating a bandwidth of a PLL. The system includes error-detection circuitry for detecting an error signal generated by the PLL in response to an input signal, circuitry for computing a difference between the integral of the error signal and a nominal value thereof, and circuitry for adjusting a bandwidth of the PLL based on the computed difference.

In one embodiment, an integrator computes an integral of the detected error signal. The difference-computing circuitry may include an arithmetic unit, and the adjusting circuitry may include an output circuit for providing a calibration signal to the PLL (which may undergo a bandwidth adjustment in response thereto). The error-detection circuitry may include a calibration charge pump and circuitry for cancelling a mismatch between the calibration charge pump and a PLL charge pump. The integrator may include an integration capacitor, which may include an array of selectable capacitors. A circuit may determine a capacitance of the integration capacitor and adjust the capacitance to a predetermined value.

An analog-to-digital converter (ADC) may digitize the error signal and/or the integral of the error signal. Circuitry may accumulate the integrated error signal and provide an accumulated error signal to the arithmetic unit (which may include a curve-fitting unit). The error signal may be amplified by at least one of the error-detection circuit or the integrator. The PLL may be used in a frequency synthesizer, RF modulator, wireless communication transceiver, clock generation circuit, data recovery circuit, and/or clock recovery circuit.

In yet another aspect, embodiments of the invention include a system for calibrating a bandwidth of a PLL. The system includes an error-detection circuit for receiving an integrated error signal generated by the PLL in response to an input signal applied to the PLL, an arithmetic unit for computing a difference between the integrated error signal and a nominal value, and an output circuit for providing a calibration signal to the PLL. The calibration signal is configured to adjust a bandwidth of the PLL. An accumulator may accumulate the integrated error signal and provide an accumulated error signal to the arithmetic unit.

In still another aspect, embodiments of the invention include a PLL. PLL circuitry generates a signal having a fixed phase relationship to a phase of an input signal, and error-detection circuitry detects an error signal generated by the PLL circuitry in response to a stimulus signal. The PLL also includes circuitry for computing the difference between the integral of the error signal and a nominal value thereof and circuitry for adjusting a bandwidth of the PLL based on the computed difference.

These and other objects, along with advantages and features of the embodiments of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 21 is a flowchart show a method for calibrating a frequency synthesizer in accordance with one embodiment of the invention.

DESCRIPTION OF THE INVENTION

Described herein are various embodiments of systems and methods for calibrating the bandwidth of a PLL, especially a PLL used as a frequency synthesizer. Calibration involves first detecting an error signal developed when a PLL input is stimulated (e.g., with a frequency step), integrating the error signal, and using deviations from the nominal value of the integral of the error signal to adjust the bandwidth of the PLL. If the characteristics of any of the analog components in the PLL vary as a result of, for example, process or environmental conditions, the calibration circuitry will detect when the integral of the error signal deviates from its nominal value and compensate for the deviation. In addition, embodiments of the invention include separate calibration methods for the additional analog components introduced by the calibration circuitry.

Figure 1:
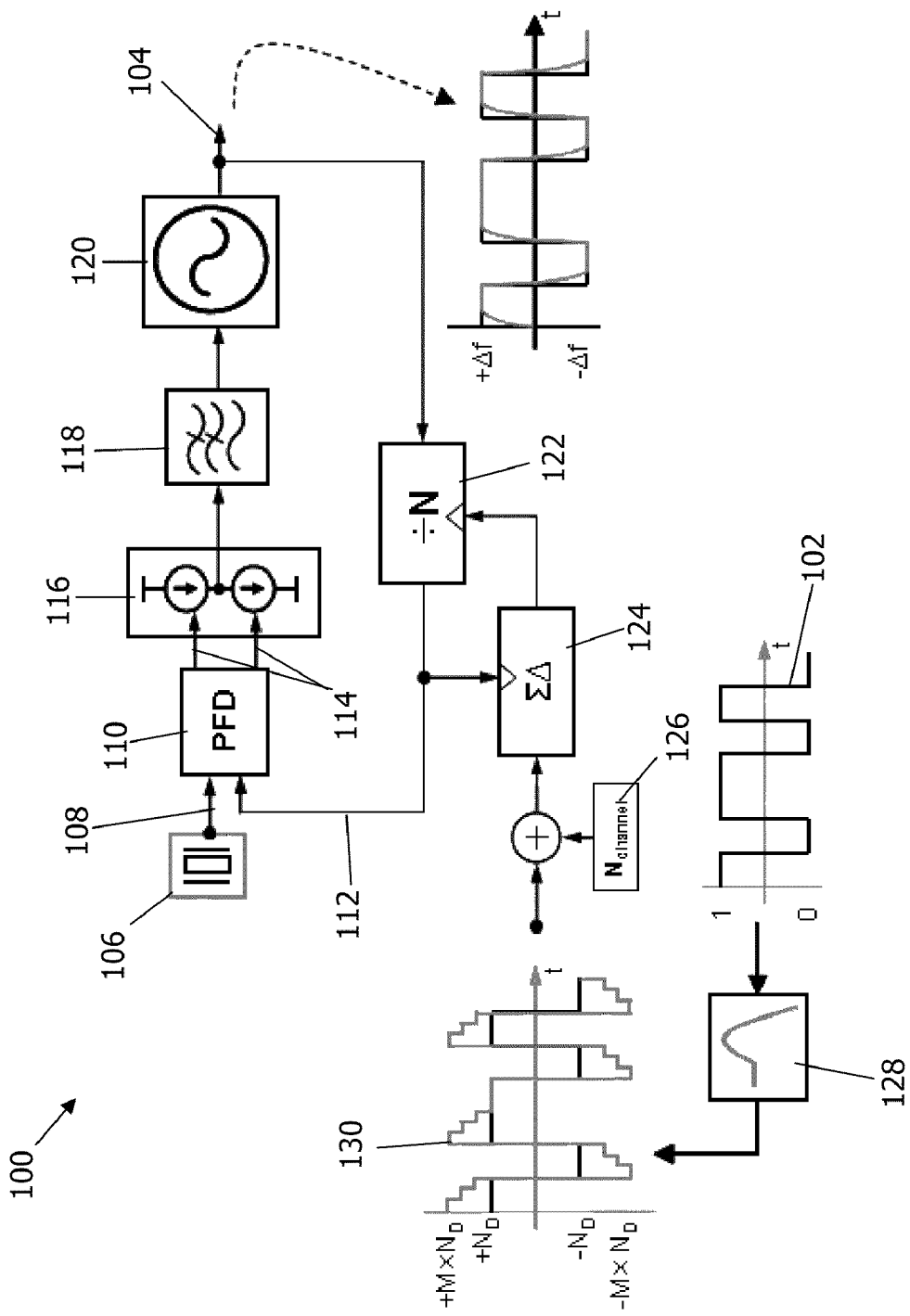
FIG. 1 schematically shows a PLL-based frequency synthesizer implementing an RF modulator.

FIG. 1 illustrates one embodiment of a PLL-based frequency synthesizer 100 implemented as an RF modulator. In general, the frequency synthesizer 100 receives a digital bit stream 102 (from, e.g., a digital processor) as an input and outputs a high-frequency signal 104, suitable for wireless transmission, modulated with the digital bit stream 102. In one embodiment, the frequency synthesizer 100 is a fractional-N frequency synthesizer, but the invention is not limited to any particular implementation of RF modulator or frequency synthesizer and may be used in any circuit involving PLL functionality.

The frequency synthesizer 100 performs two high-level functions: generating an RF frequency and modulating that frequency with the digital bit stream 102. Generating the RF frequency begins with a crystal oscillator 106 that generates a reference signal 108 for a phase-frequency detector (PFD) 110. The PFD 110 compares the phase of the reference signal 108 to a feedback signal 112 and outputs a phase error signal 114 representing this comparison. In one embodiment, the phase error signal 114 is high if the phase difference between the reference signal 108 and the feedback signal 112 is large and low if the phase difference between the reference signal 108 and the feedback signal 112 is small. A charge pump 116 is controlled by the outputs of the PFD 110 and generates an amount of charge proportional to the phase error at the output of the PFD 110. This generated charge is integrated by a resistor-capacitor (RC) passive loop filter 118, and the output of the loop filter 118 may be, in turn, fed into a voltage-controlled oscillator (VCO) 120. The output of the VCO 120 provides the output signal 104, and is also divided down by a factor of N by an N-divider circuit 122, the output of which supplies the feedback signal 112 to the PFD 110.

The generated RF frequency 104 is modulated with the digital input stream 102 by changing an N-divider word $N_D$ of the N-divider 122 in accordance with the data bits 102 to be transmitted. In one embodiment, the frequency synthesizer 100 has a center frequency $f_o$ corresponding to an N-divider word $N_{Do}$. To transmit "1", the N-divider word $N_D$ is increased to $N_{Do}+\Delta N_D$, thereby increasing the frequency of the output signal 104. To transmit a zero, the N-divider word $N_D$ is decreased to $N_{Do}-\Delta N_D$, thereby decreasing the frequency of the output signal 104. A sigma-delta modulator 124 supplies the N-divider word $N_D$ to the N-divider 122 based on the input bit stream 102 and an $N_{channel}$ factor 126.

Because the transmitter architecture of the frequency synthesizer 100 may exhibit, to the data bit stream 102, a closed-loop response similar to that of a low-pass filter, the frequency synthesizer 100 may face a fundamental trade-off between having a bandwidth sufficiently wide to transmit high-data-rate signals and a bandwidth low enough to satisfy spectral mask and emission requirements. To mitigate the constraints of this trade-off, the frequency synthesizer 100 may use a digital pre-emphasis filter 128 to condition the input data stream 102 into a pre-emphasized input data stream 130. The digital pre-emphasis filter 128 may be configured to have a frequency response that, ideally, matches the inverse of the low-pass frequency response of the frequency synthesizer 100. The cascaded bandwidth of the digital pre-emphasis filter 128 and the frequency synthesizer 100 may thus appear larger to the input data stream 102 (or, ideally, as infinite).

In greater detail, the digital pre-emphasis filter 128 pre-emphasizes the high-frequency components of the input digital bit stream 102, producing pre-emphasized frequency-division inputs±M×$N_D$ in the pre-emphasized input data stream 130. Due to the closed-loop nature of the frequency synthesizer 100, the VCO 120 adjusts itself to generate the appropriate frequency deviations Δf in response to the input frequency-division values at the correct data rate.

Figure 2:
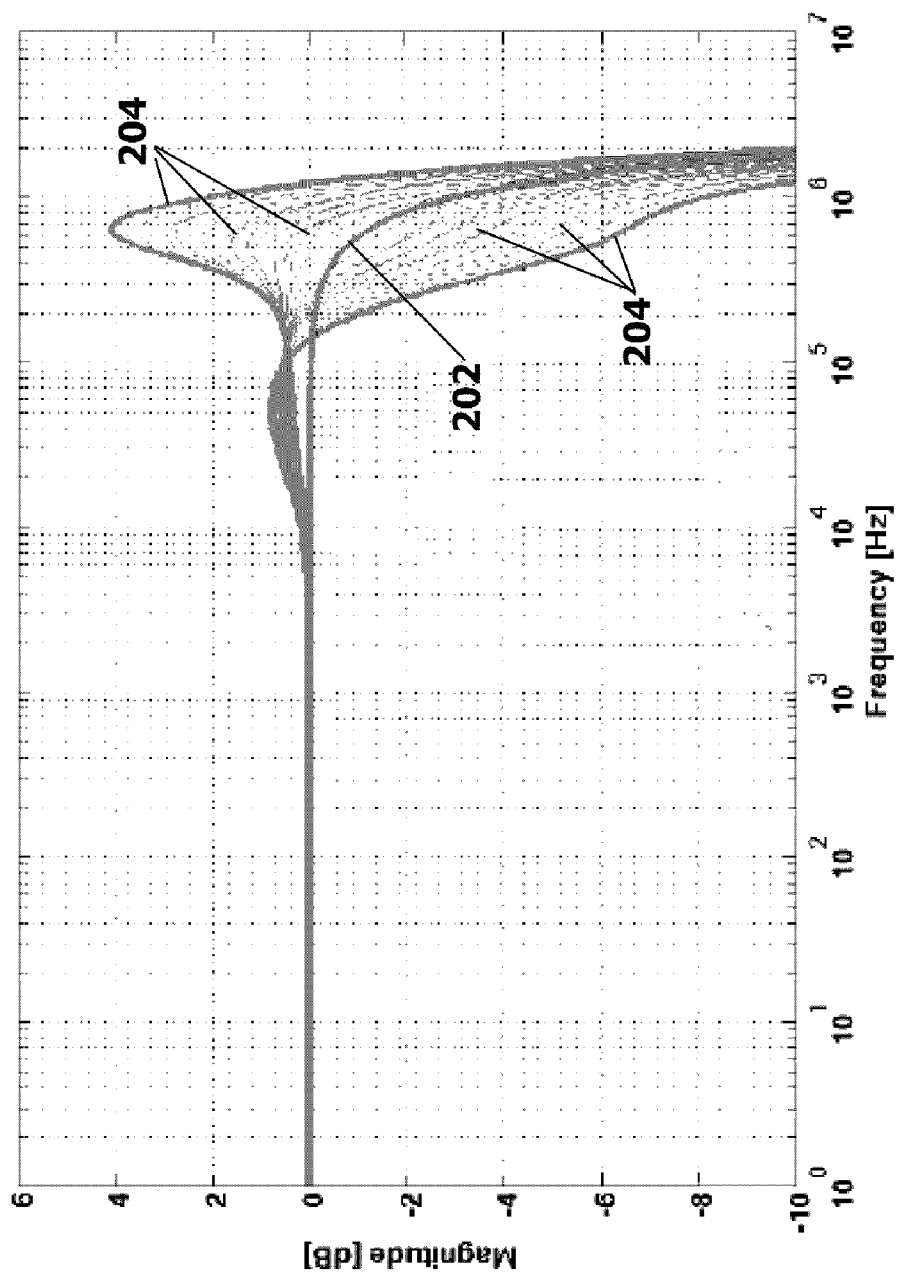
FIG. 2 graphically depicts a target bandwidth and bandwidth variation for a frequency synthesizer.
Figure 3:
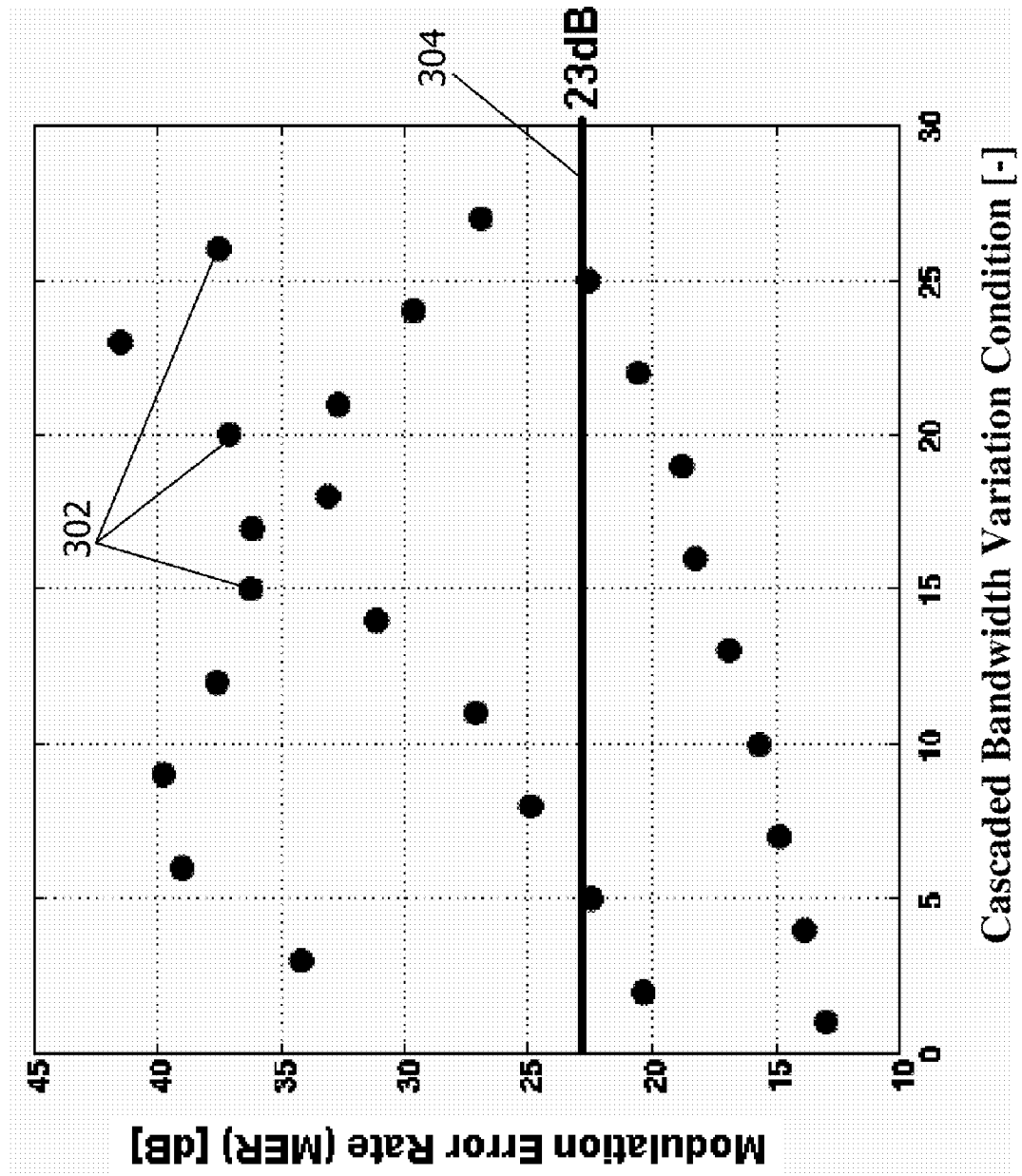
FIG. 3 graphically depicts an MER for a frequency synthesizer under various conditions.

FIG. 2 shows the ideal target 3 dB bandwidth 202 for a 2 Mbps Gaussian Frequency Shift Keying (GFSK) signal using a GFSK filter with a bandwidth-bit-period product (BT) of 0.5. A set of curves 204 shows the cascaded digital pre-emphasis filter and PLL bandwidth variation in the presence of ±6% charge-pump current variation, ±20% loop-filter resistance variation, ±20% loop filter capacitance variation, and ±30% VCO gain variation. The 3 dB bandwidth of the ideal curve 202 is approximately 1 MHz; the 3 dB bandwidth in the presence of component variation, however, may vary from approximately 0.3 MHz to approximately 3 MHz. This large variation may have the adverse effect of degrading the MER as well as the transmitter emissions and spectral mask requirements. FIG. 3 shows the MER 302 computed for a frequency synthesizer at a variety of process corners and illustrates that, due to the cascaded bandwidth variations depicted in FIG. 2, the absolute value of the MER may vary so widely that it falls below a target value 304 (here, 23 dB) required by an application.

I. Analysis of an Error Signal in a Closed-Loop Control System

Figure 4:
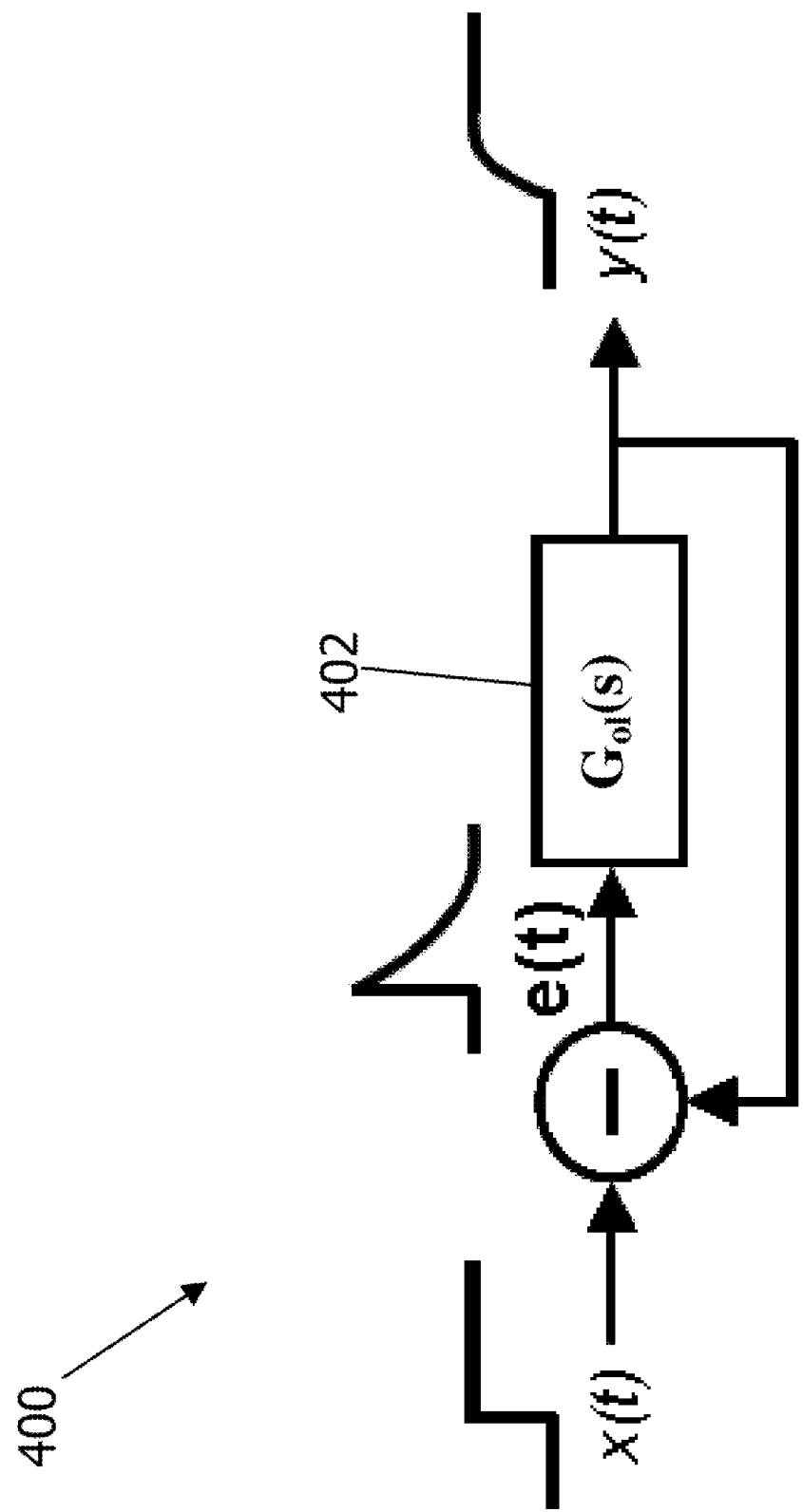
FIG. 4 schematically shows an exemplary closed-loop system.

Calibration systems in accordance with embodiments of the current invention take advantage of a mathematical property of a closed-loop control system described herein. FIG. 4 shows a block diagram of an exemplary closed-loop control system 400 featuring a transfer function block 402. If an input stimulus, for example, a step input x(t), is applied to the system, an output y(t) is produced in response. The settling time for the output y(t) (i.e., the amount of time the output takes to transition in response to the step input x(t)) depends on the bandwidth of the system 400. The error signal e(t) is defined as the difference between the output y(t) and the input x(t).

Figure 5:
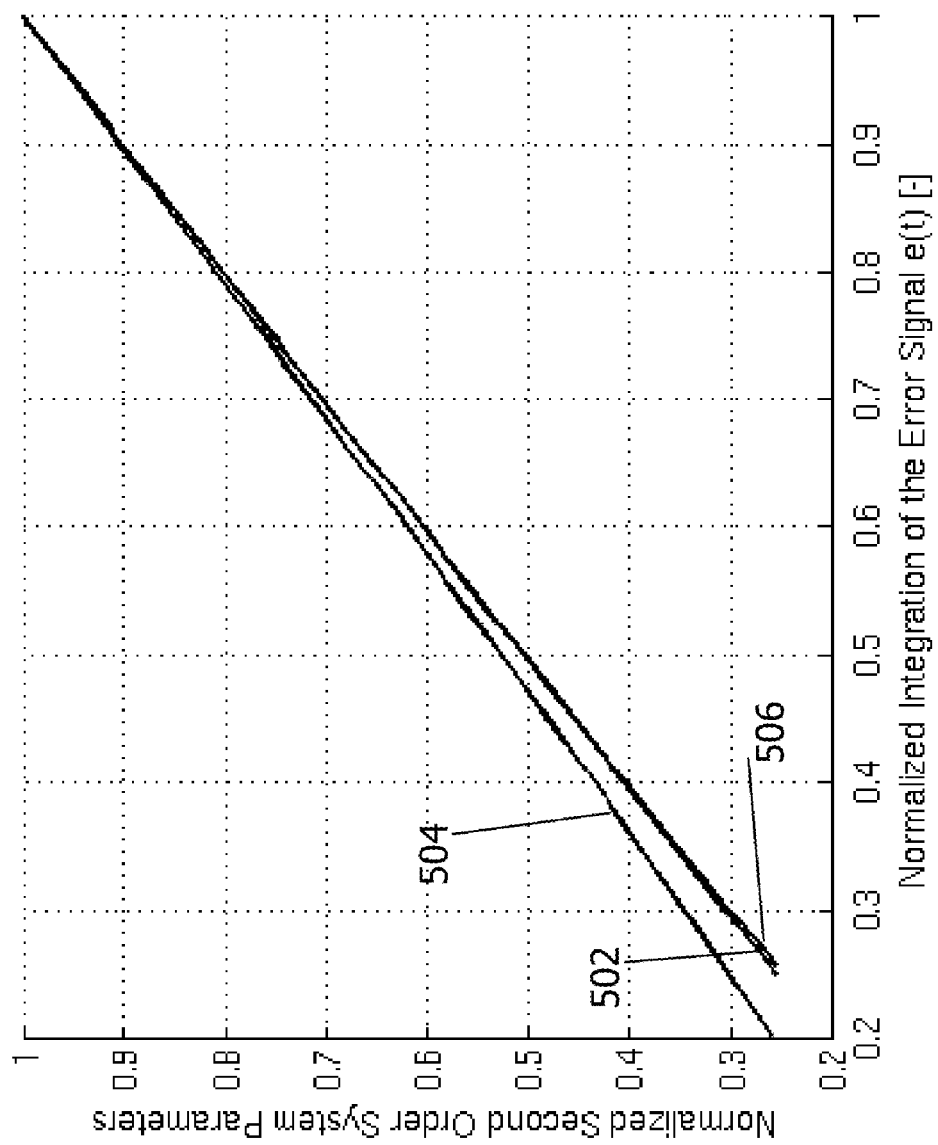
FIG. 5 graphically depicts a relationship between an integrated error signal and other closed-loop system parameters.

FIG. 5 shows a relationship between the integral of the error signal e(t) and various parameters of the closed-loop control system 400. In one embodiment, the closed-loop control system 400 is a second-order system with a 450 kHz bandwidth; the analysis herein, however, may be carried out on any closed-loop system of any order with similar results. The error signal e(t) is integrated over a time period (e.g., 20 μs) as a damping parameter ξ is varied. The integral of the error signal e(t) is computed for every value of the damping parameter ξ in response to the input step x(t). Moreover, for every value of the damping parameter ξ, three additional parameters are computed: the inverse of the loop gain 502, the inverse of the closed-loop 3 dB bandwidth 504, and the inverse of the unity-gain frequency 506. The integral of the error signal e(t) and the computed parameters 502, 504, 506 are then normalized to their respective maximum values. As shown by the substantially linear plots of FIG. 5, the computed parameters 502, 504, 506 are essentially linear functions with respect to the normalized integral of the error signal e(t).

The normalized inverse loop gain 502 of the system is also the normalized inverse of the gain of the open-loop frequency response of the system transfer function $G_{ol}(s)$ embodied by the transfer function block 402. Therefore, the normalized integration of the error signal e(t) is also a linear function of the normalized-inverse unity gain frequency of the open-loop frequency response of the system (i.e., the transfer function $G_{ol}(s)$). Conceptually, as the closed-loop bandwidth of the system decreases, the time spent by the output to reach its target value and the time spent by the error signal to decay to zero both increase, resulting in an increase in the value of the integral of the error signal e(t). The same inverse relationship between the closed-loop bandwidth and the integral of the error signal e(t) occurs when the closed-loop bandwidth of the system increases.

The characteristics of the exemplary closed-loop system 400 may be applied to the PLL-based frequency synthesizer 100 described above. A frequency synthesizer may be considered as a closed-loop control system having an N-divider word $N_D$ as an input and the desired frequency—the reference frequency multiplied by the N-divider word $N_D$—as an output. When the frequency synthesizer 100 is used as a transmitter, the value of $N_D$ is altered depending on the bit-stream to be transmitted, as described above. As a result, the center frequency of the frequency synthesizer 100 may change to, for example, $f_o$+Δf in response to bit '1' and to $f_o$−Δf in response to bit '0'.

Figure 6:
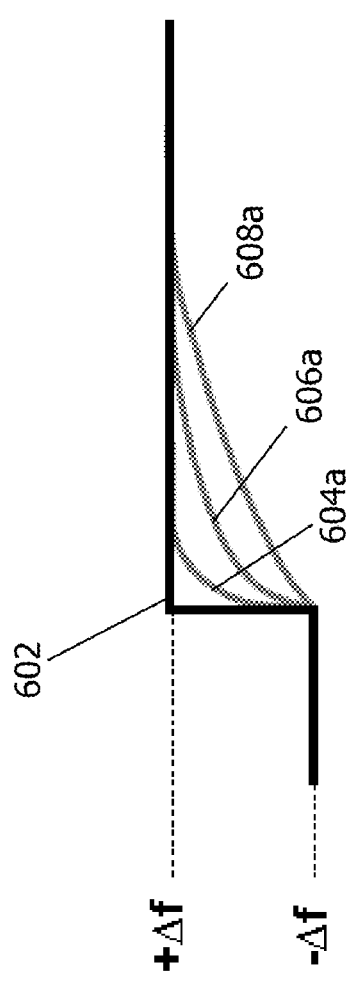
FIG. 6 shows various closed-loop output signals.

FIG. 6 illustrates a step input 602 corresponding to the step input x(t) described above with reference to FIG. 4 and applied to the input of the frequency synthesizer 100. The step input 602 has a minimum value of $N_D=N_{Do}-\Delta N_D$ and a maximum value of $N_D=N_{Do}+\Delta N_D$ (not shown). In response to the step input 602, the output of the frequency synthesizer 100 may change from $f_o$−Δf to $f_o$+Δf at different rates 604a, 606a, 608a in accordance with varying bandwidths of the frequency synthesizer 100.

Figure 7:
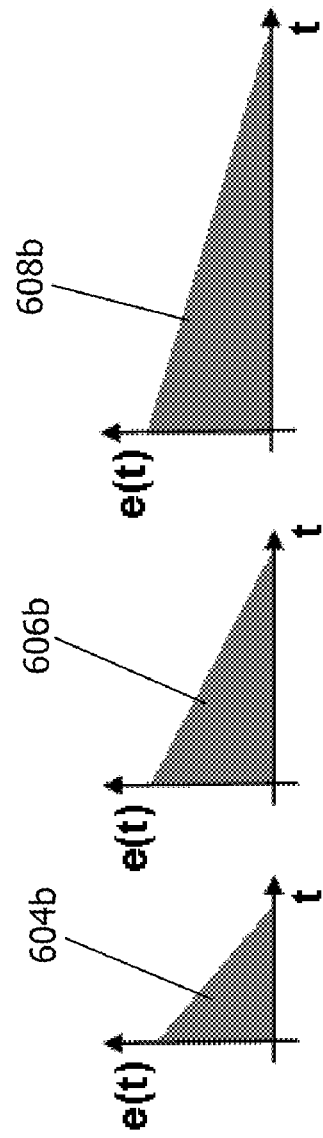
FIG. 7 shows error signals corresponding to various closed-loop output signals.

FIG. 7 illustrates error signals 604b, 606b, 608b corresponding to the output signals 604a, 606a, 608a. The error signals 604b, 606b, 608b may be used to analyze the bandwidth of the frequency synthesizer 100, as described above. One error signal 606b corresponds to a nominal value of the bandwidth of the frequency synthesizer 100. If the bandwidth of the frequency synthesizer 100 falls below the nominal value, however, the output 608a of the frequency synthesizer 100 takes longer to transition to its final level, and the area under the corresponding error curve 608b increases. On the other hand, if the bandwidth of the frequency synthesizer 100 increases past its nominal value, it takes less time for the output 604a to reach its final level, and the area under the corresponding error curve 604b decreases. In general, the area under an error curve 604b, 606b, 608b (i.e., the integral of the error signal e(t)) increases or decreases proportionately with a change in the bandwidth of the frequency synthesizer 100.

II. Detection of the Error Signal in a Frequency Synthesizer

Figure 8:
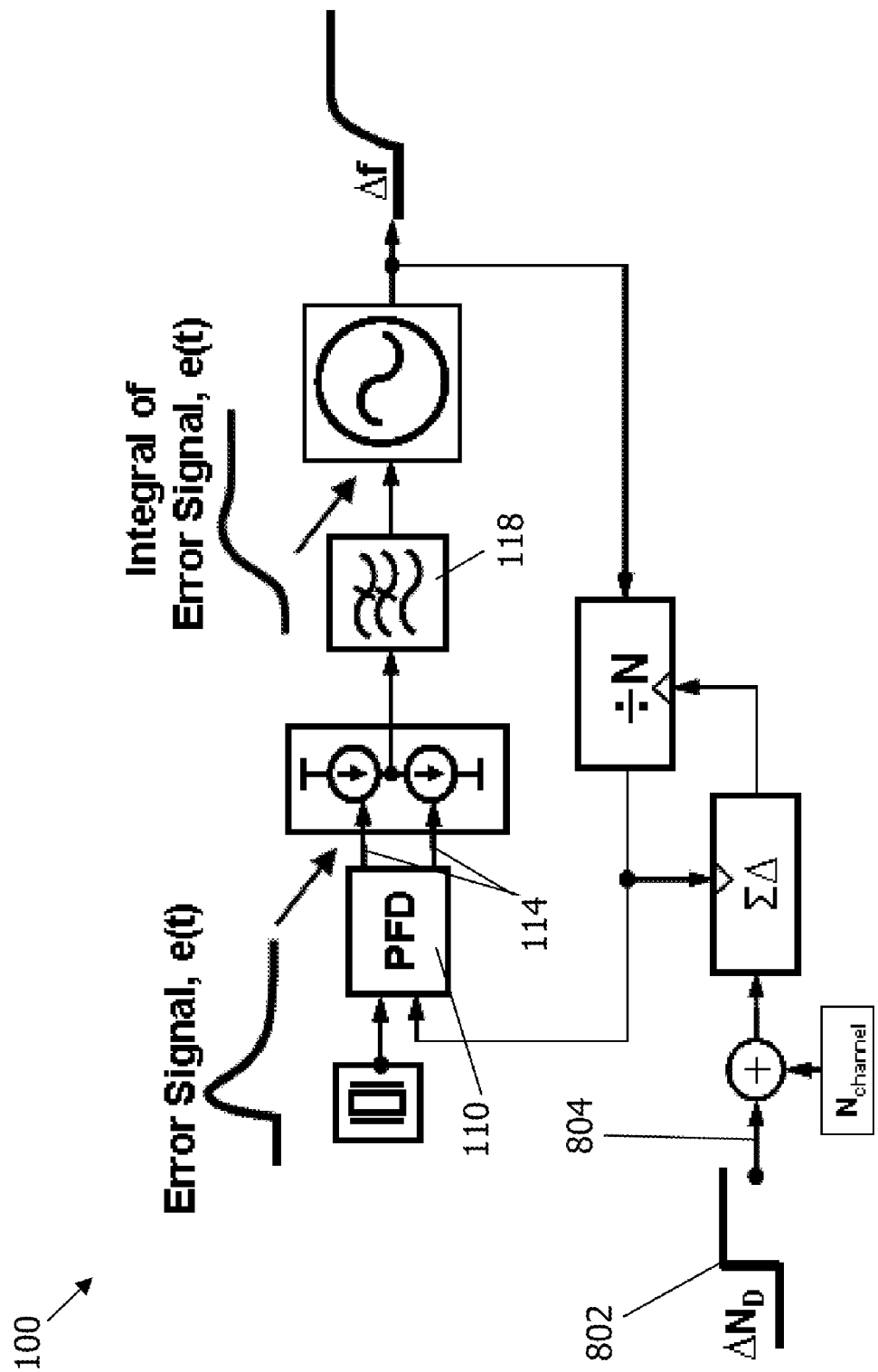
FIG. 8 schematically shows a step signal applied to a frequency synthesizer.

In order to utilize the relationship between the error signal e(t) and the bandwidth of the frequency synthesizer 100 described above, the error signal e(t) must first be identified. FIG. 8 illustrates one embodiment of the frequency synthesizer 100 in which an input stimulus 802 (for example, a step N-divider value $\Delta N_D$) is applied to an input 804 of the frequency synthesizer 100 and a frequency step Δf is observed in response. When the step input $\Delta N_D$ is applied, the PFD 110 generates a corresponding phase error signal 114, as described above. The phase error signal 114 corresponds to the difference between the effect of the input $\Delta N_D$ on the crystal oscillator reference and the output Δf, and thus is equivalent to the error signal e(t) described above with reference to FIG. 4. The phase error signal 114, therefore, may be used like the error signal e(t), as discussed above, to predict the bandwidth of the frequency synthesizer 100. In one embodiment, the integration of this error signal e(t) is generated by the loop filter 118.

The loop gain $H_{ol}$ of a conventional frequency synthesizer having a third order loop filter is given by:

$$H_{ol}=V_{bg}\cdot K_{vco}\cdot N_{divider}/(R\cdot C) \qquad (1)$$

where $V_{bg}$ is the bandgap voltage reference for the charge-pump current, $K_{vco}$ is the VCO gain, $N_{divider}$ is the value of the N-divider, R is the resistor that converts the bandgap voltage reference into a charge-pump current, and C is the sum of all capacitors in the synthesizer passive loop filter. Equation (1) shows that the calibration method of the present invention, because it calibrates the loop gain $H_{ol}$, captures and accounts for variations in any of the components that affect the loop gain $H_{ol}$.

III. Using the Error Signal to Calibrate the Bandwidth of the Frequency Synthesizer In one embodiment, the integral of the error signal e(t) is directly digitized from the output of the loop filter 118 with a high-resolution ADC. If, for example, a value of $N_D$ corresponding to a 1 MHz step is applied, and the VCO 120 has a practical gain of 40 MHz/V, the steady-state value of the integrated error signal is 25 mV. A 12-bit ADC has an least-significant bit (LSB) of 0.3 mV (using a 1.2 V reference), yielding 83 LSBs for capturing the transient of the error signal e(t). The high-resolution ADC may be used in applications where power consumption is not a primary constraint.

In one embodiment, the power requirements of a direct-digitization system are reduced by first amplifying the output of the loop filter 118 before the integral of the error signal is digitized by the high-resolution ADC. A fully integrated frequency synthesizer, however, may include a fully integrated passive loop filter and two tuning ports for tuning the VCO. Because both the tuning ports contribute to the transient response of the frequency synthesizer, both tuning ports affect the integral of the error signal. In this embodiment, combining both tuning ports signals requires, e.g., a voltage-summing amplifier. Alternatively, the integral of the error signal may be detected using only one tuning port with a corresponding loss in accuracy.

Figure 9:
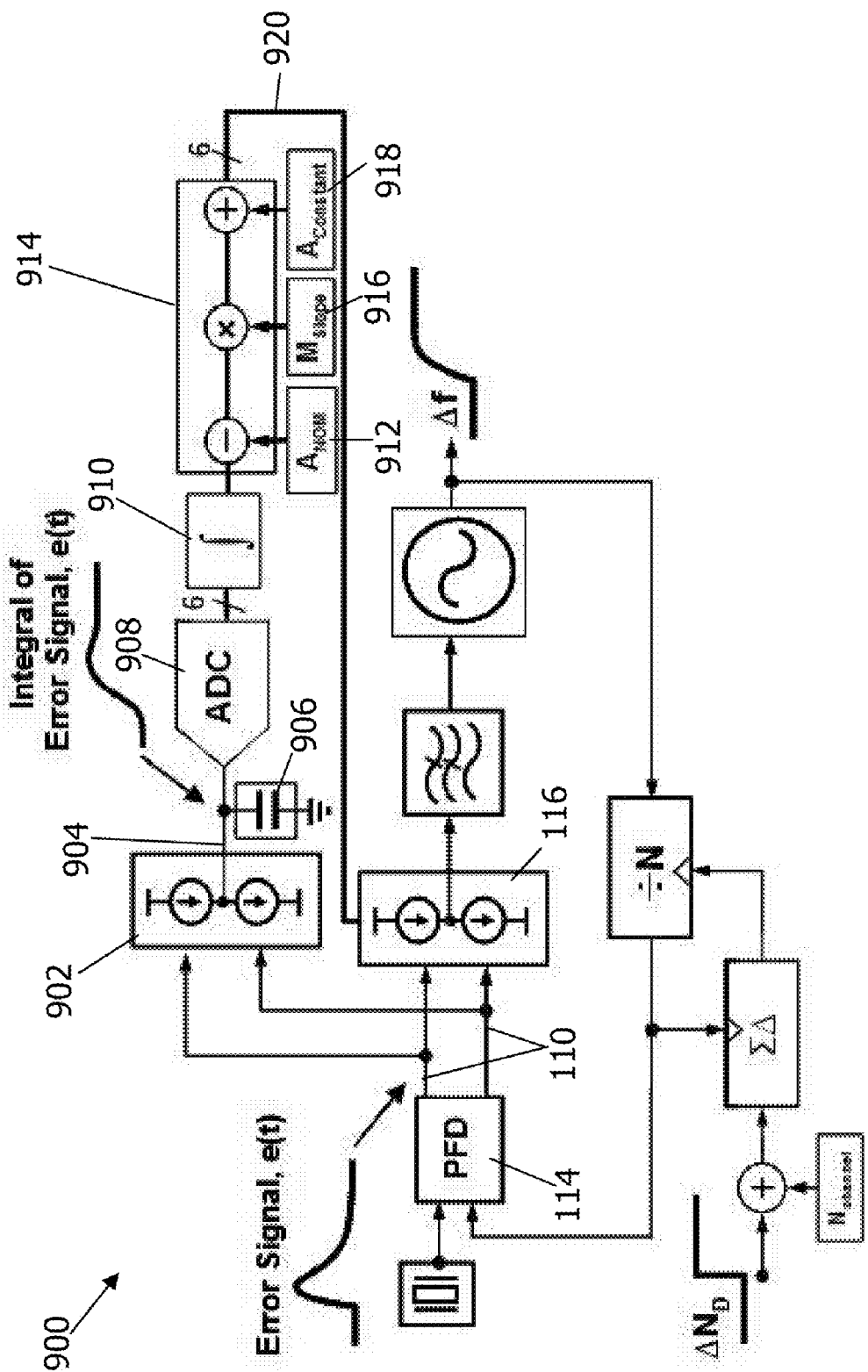
FIG. 9 schematically shows a frequency synthesizer bandwidth calibration circuit in accordance with one embodiment of the invention.

In other embodiments, where low power consumption is required, a high-resolution ADC is not practical. Instead, the integral of the error signal may be derived from the frequency synthesizer 100. FIG. 9 illustrates a representative low-power and area-efficient system 900 for extracting the integral of the error signal from the frequency synthesizer 100, in accordance with embodiments of the invention, without using a high-resolution ADC or a voltage-summing amplifier. The system 900 includes a conventional frequency synthesizer, but the calibration system of the current invention may also be applied to any type of frequency synthesizer (e.g., one featuring an integrated passive loop filter).

The system 900 detects the error signal e(t) at the outputs 114 of the PFD 110. A calibration charge pump 902 converts the digital pulses at the output 114 of the PFD 110 to current pulses at the charge-pump output 904. The current pulses are integrated on an integration capacitor 906 to generate a voltage signal that represents the integral of the error signal (i.e., the area under the error signal curve). The voltage developed on the integration capacitor 906 is digitized by an ADC 908. The calibration charge pump 902 and integration capacitor 906 may control the voltage ramp rate of the integral of the error signal e(t), allowing for the digitization to occur in its most linear region, thus improving the accuracy of the measurement. In one embodiment, the calibration charge-pump current is scaled to a higher value than the current in the frequency synthesizer charge pump 116, thereby amplifying the error signal e(t). The amplification may be sufficient to enable the use of a low-resolution ADC, such as a 6-bit ADC.

The output of the ADC 908 may be further integrated with a second integrator 910, thereby enhancing the accuracy of the measurement. In one embodiment, the second integrator 910 is a digital accumulator.

The integrated error signal may be compared to a nominal value 912 by an arithmetic unit 914. The nominal value 912 corresponds to a nominal bandwidth of the frequency synthesizer 100 and any deviation from this nominal value may indicate a variation in the bandwidth. The difference between the nominal value 912 and a current measured value may thus be an indication of the change in the bandwidth of the frequency synthesizer. As explained further below, the arithmetic unit 914 may also curve-fit a plurality of measured error signal integrals to, for example, a linear function or higher order polynomial. The arithmetic unit 914 may use further parameters $M_{slope}$ 916 and $A_{constant}$ 918 to fit the measured error signals to a linear function.

As described above, the integral of the error signal (generated by the output of the ADC integrator 910) is inversely proportional to the bandwidth of the frequency synthesizer 100, as is the deviation of the measured ADC integrator value from the nominal value 912. Because the bandwidth of the frequency synthesizer 100 is directly proportional to the current provided by the frequency synthesizer charge pump 116, the charge pump 116 may be used to control the bandwidth (in other embodiments, components such as the N-divider 122, VCO 120, and/or loop filter 118 are used to control the bandwidth). For example, if the bandwidth of the frequency synthesizer 100 is too wide, the current in the frequency synthesizer charge pump 116 must be decreased, and vice versa. Thus, required adjustments to the charge pump 902 are inversely proportional to the frequency synthesizer bandwidth, and, accordingly, the amount that the ADC integrator output deviates from the nominal value 912 is directly proportional to the current of the calibration charge pump 902.

In one embodiment, the frequency synthesizer charge pump 116 is an array of unit charge-pump current units that may be individually selected by the calibration system 900 according to the measured deviations at the ADC integrator output. This implementation is referred to in subsequent references as a frequency-synthesizer charge-pump digital-to-analog converter (DAC). An output 920 of the arithmetic unit 914 may be fed back to the charge pump 166 to adjust its value. In one embodiment, the output 920 is a 6-bit digital signal, and may select up to 64 charge-pump current units. The output 920 is not limited to any particular size, however, and may be analog and/or digital.

Figure 10:
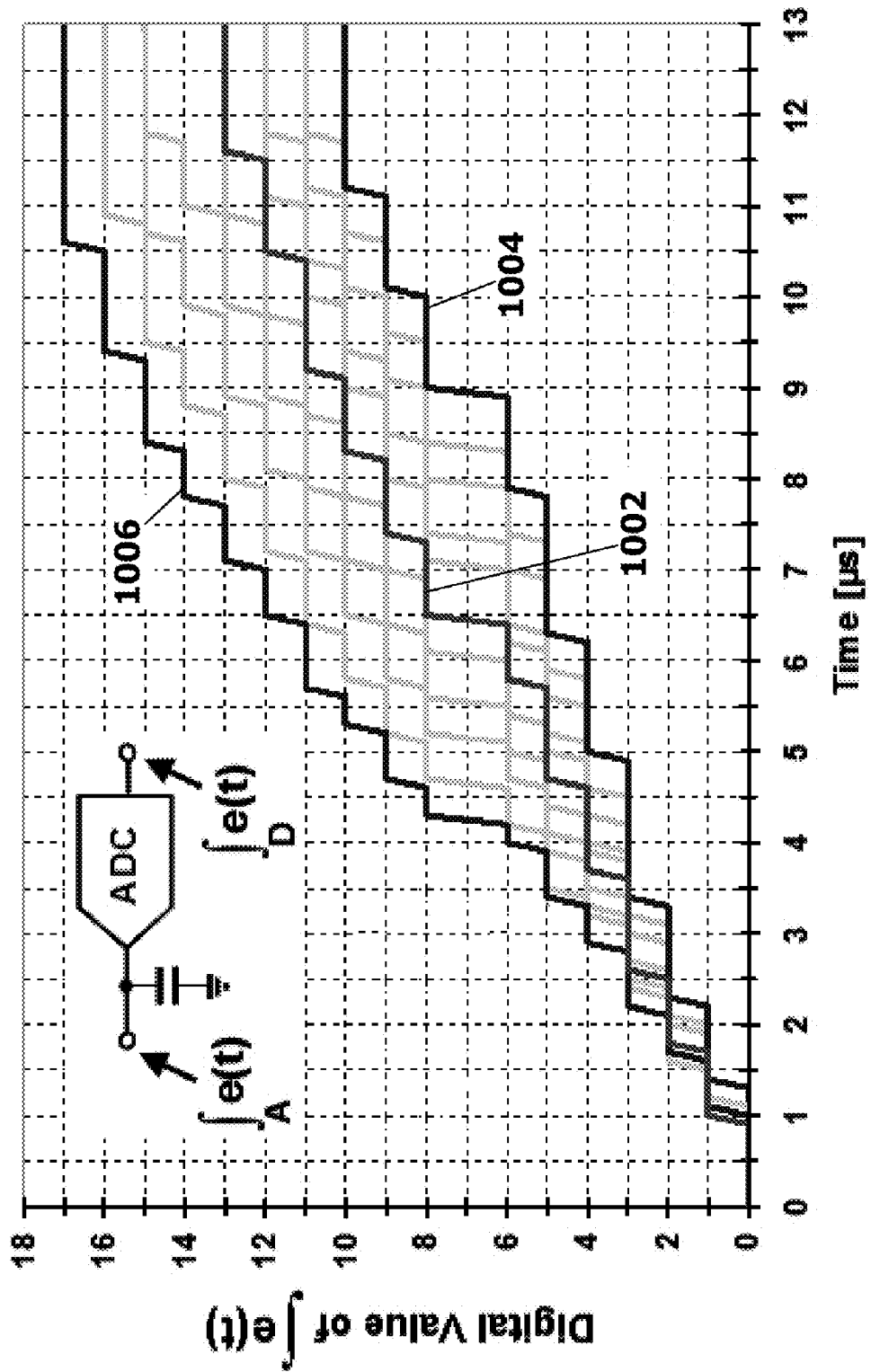
FIG. 10 graphically depicts a time-domain digitized error signal in accordance with one embodiment of the invention in the presence of frequency synthesizer bandwidth variations.

FIG. 10 illustrates the time-domain digitized value $\int_D e(t)$ of the integral of the error signal $\int_A e(t)$ as it appears at the ADC output. A frequency step signal is applied to the frequency synthesizer 100 in the presence of ±50% variation in the PLL bandwidth. As FIG. 10 shows, the digitized value $\int_D e(t)$ assumes a nominal value 1002 when no variation in bandwidth is present, a decreased value 1004 with increased bandwidth, and an increased value 1006 with decreased bandwidth.

Figure 11:
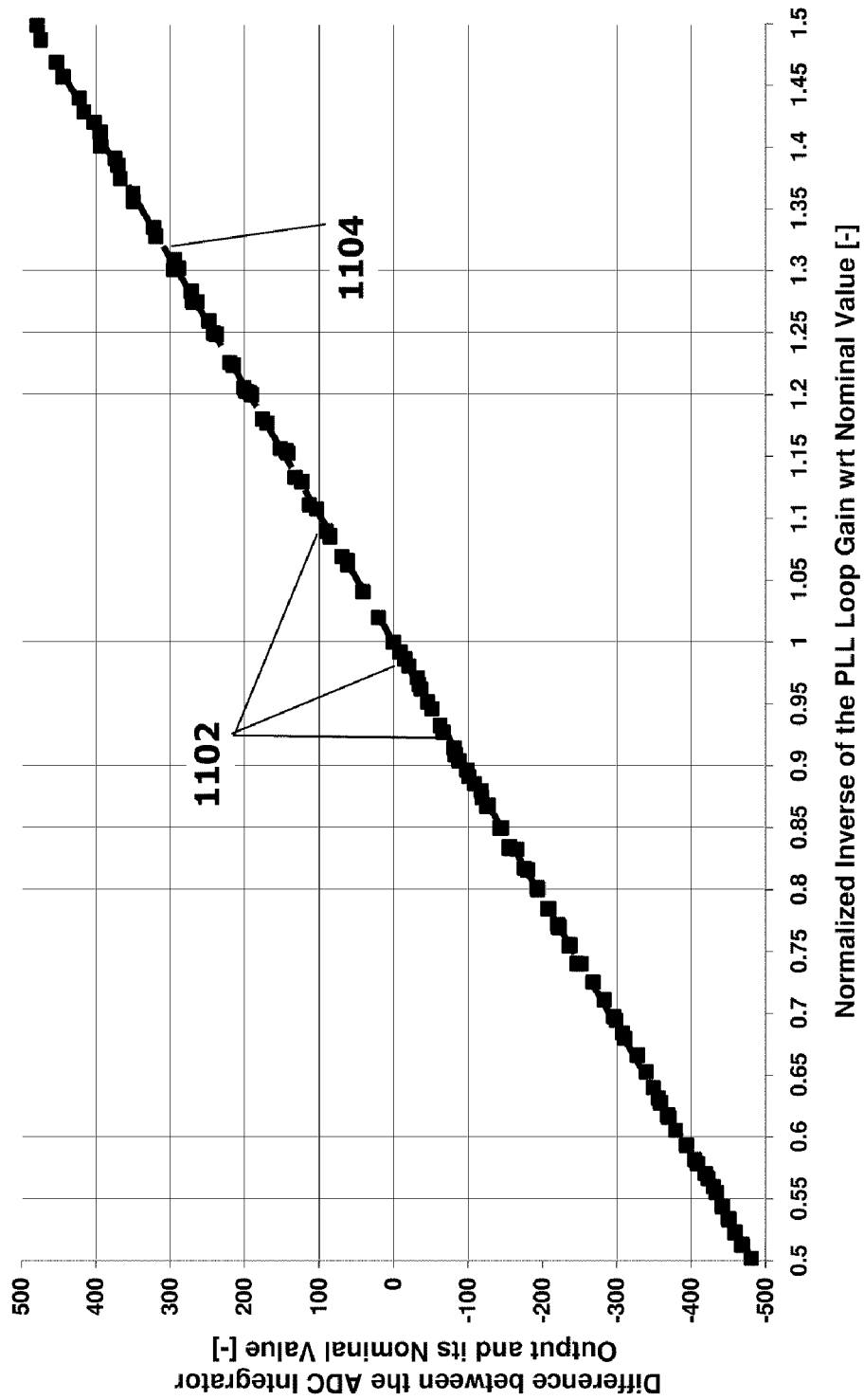
FIG. 11 graphically depicts the relationship between a normalized inverse of the magnitude of the loop gain of the frequency synthesizer and a calibration circuit output in accordance with one embodiment of the invention.

FIG. 11 shows the relationship between the normalized inverse of the magnitude of the loop gain of the frequency synthesizer transfer function in the presence of ±50% variation in the frequency synthesizer versus the value of the difference between the ADC integrator output and its nominal value for a plurality of points 1102. The variation in the frequency synthesizer bandwidth is approximately proportional to the variation in the loop gain of the frequency-synthesizer transfer function. As indicated, the relationship between the two parameters of FIG. 11 may be linear. Thus a simple fitting equation of the form $M_{slope}\cdot x+A_{constant}$ may be used to define the relationship between these two parameters, where x is the value of the difference between the current and the nominal ADC integrator outputs. Using the fitted line 1104, a precise measurement of the bandwidth may be made, and the measured bandwidth deviations may be used to perform a bandwidth calibration. For example, referring to FIG. 9, the difference between the output of the ADC integrator 910 and the nominal value 912 may be scaled by $M_{slope}$ 916 and added to the constant value $A_{constant}$ 918. The result may then be truncated and used to control the frequency-synthesizer charge-pump current DAC to adjust the bandwidth of the synthesizer 100.

IV. Calibration Charge-Pump Mismatch Cancellation

The calibration charge pump 902, as described above, may be used to convert digital pulses at the PFD output 110 into a voltage on the integration capacitor 906, thereby replicating the operation of the frequency-synthesizer charge pump 116 in the frequency synthesizer 100. In the physical design, the calibration charge pump 902 may be designed as a charge-pump DAC with units embedded within the frequency-synthesizer charge-pump DAC units to increase matching between the two charge pumps. A mismatch may remain, however, and degrade the accuracy of the bandwidth calibration system, so a mismatch detection and cancellation mechanism between the calibration and the frequency-synthesizer charge pumps may be used to remove any remaining mismatch.

The first step in implementing a charge-pump mismatch cancellation circuit is recognizing that when the frequency synthesizer 100 is locked, the divided VCO signal 112 and the crystal oscillator reference signal 108 are phase-locked and no further corrections to the VCO 120 are required. Thus, in this state, the average charge delivered from the frequency-synthesizer charge pump 116 to the loop filter 188 is substantially zero, and the corresponding charge delivered to the integration capacitor 906 should be substantially zero. If, however, there is a mismatch between the calibration charge pump 902 and the frequency-synthesizer charge pump 116, the charge delivered to the integration capacitor 906 by the calibration charge pump 902 is non-zero. Detection of this non-zero charge may be used to detect the mismatch between the two charge pumps. If, prior to applying a stimulus step $\Delta N_D$ to the frequency synthesizer input, the calibration charge pump 902 is allowed to integrate any mismatch charge on the integration capacitor for a predetermined amount of time, a voltage may develop on the integration capacitor 906 that is proportional to the amount of the mismatch. This voltage may be digitized by the ADC 908 and integrated using the same hardware described above. The calibration, therefore, may have two phases: a first phase to detect a mismatch between the frequency synthesizer and calibration charge pumps 116, 902 and a second phase to cancel the mismatch between the frequency synthesizer charge pump and the calibration charge pump and to calibrate the frequency synthesizer bandwidth by adjusting its charge pump 116. In another embodiment, the first phase detects and cancels a mismatch between the frequency synthesizer and calibration charge pumps 116, 902 and the second phase calibrates the frequency synthesizer bandwidth by adjusting its charge pump 116

Figure 12A:
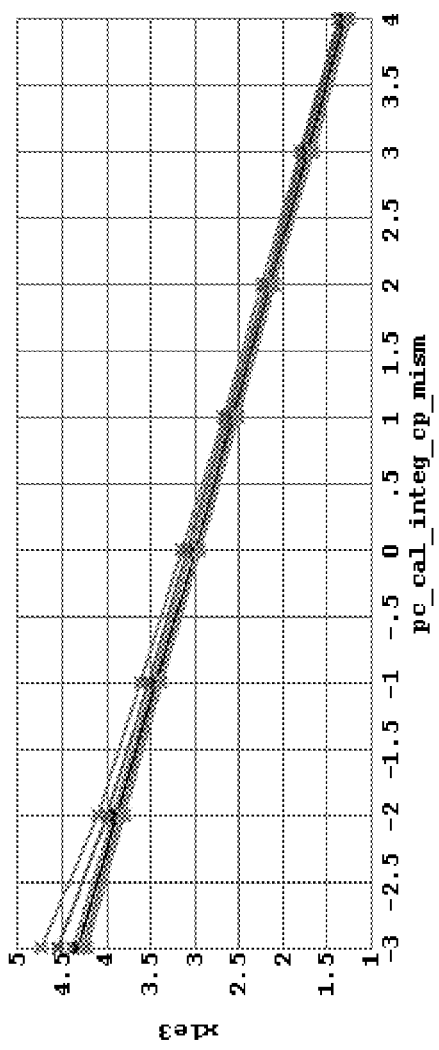
FIGS. 12A and 12B graphically show a linear relationship between the percentage mismatch (between the calibration charge pump and the frequency synthesizer charge pump) and the ADC integrator outputs in accordance with one embodiment of the invention.
Figure 12B:
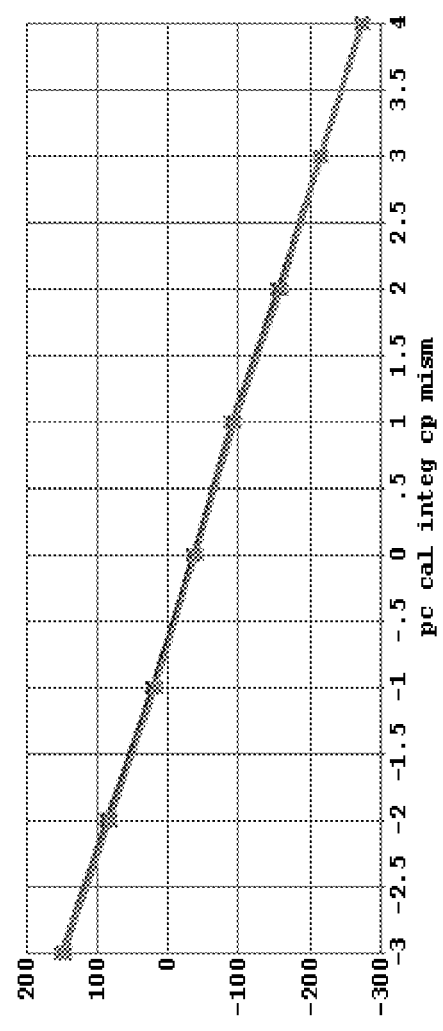

FIGS. 12A and 12B show the percentage mismatch between the charge pumps versus the ADC integrator outputs for calibration phases one and two. More specifically, FIG. 12A illustrates the ADC integrator output after applying the stimulus step $\Delta N_D$ to the frequency synthesizer and FIG. 12B illustrates the ADC integrator output during the mismatch detection phase. A ±4% mismatch is present between the calibration and the frequency-synthesizer charge pumps as well as a ±0.1 ns timing mismatch between the up and down pulses of the calibration charge pump relative to that of the frequency-synthesizer charge pump. In one embodiment, the timing mismatch between the charge pumps is between −0.1 and 0.1 ns.

FIGS. 12A and 12B illustrate that a linear relationship may exist between the percentage mismatch and the ADC integrator outputs in the first and second phases. This linear relationship indicates that the percentage mismatch may be detected using the ADC integrator output in the first phase and cancelled from the value of the ADC integrator 910 in the second phase. FIGS. 12A and 12B also show that, due to timing mismatches, a non-zero integrator value may be recorded in the first phase when the percentage mismatch between the two charge pumps is zero. This value is acceptable because, while some timing mismatches may always be present and may slightly change with process variations, the timing mismatches may have a relatively fixed, and relatively small, value.

Figure 13:
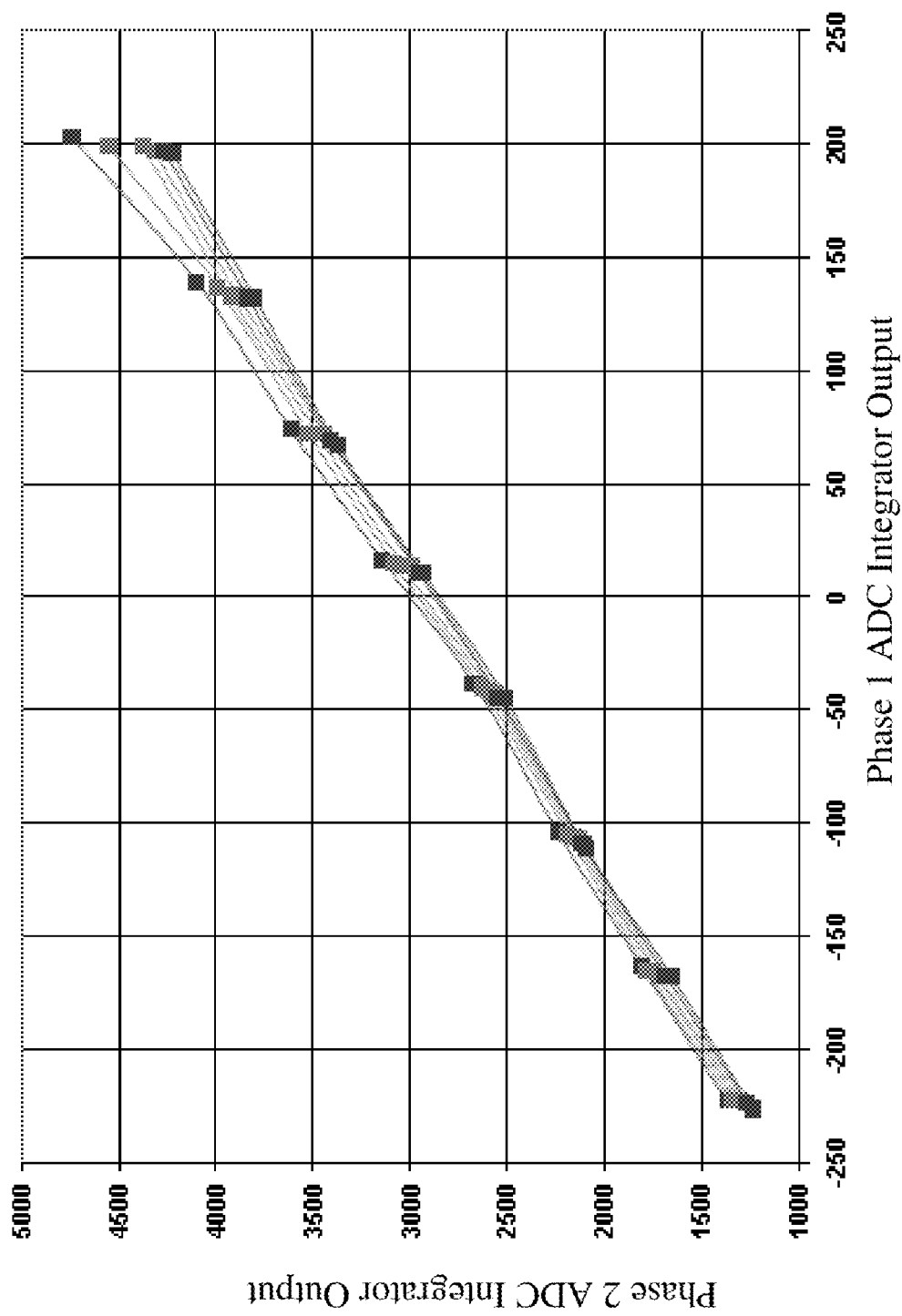
FIG. 13 graphically depicts a linear relationship between the ADC integrator outputs in first and second calibration phases for different timing mismatches between calibration and the frequency synthesizer charge pumps in accordance with one embodiment of the invention.
Figure 14:
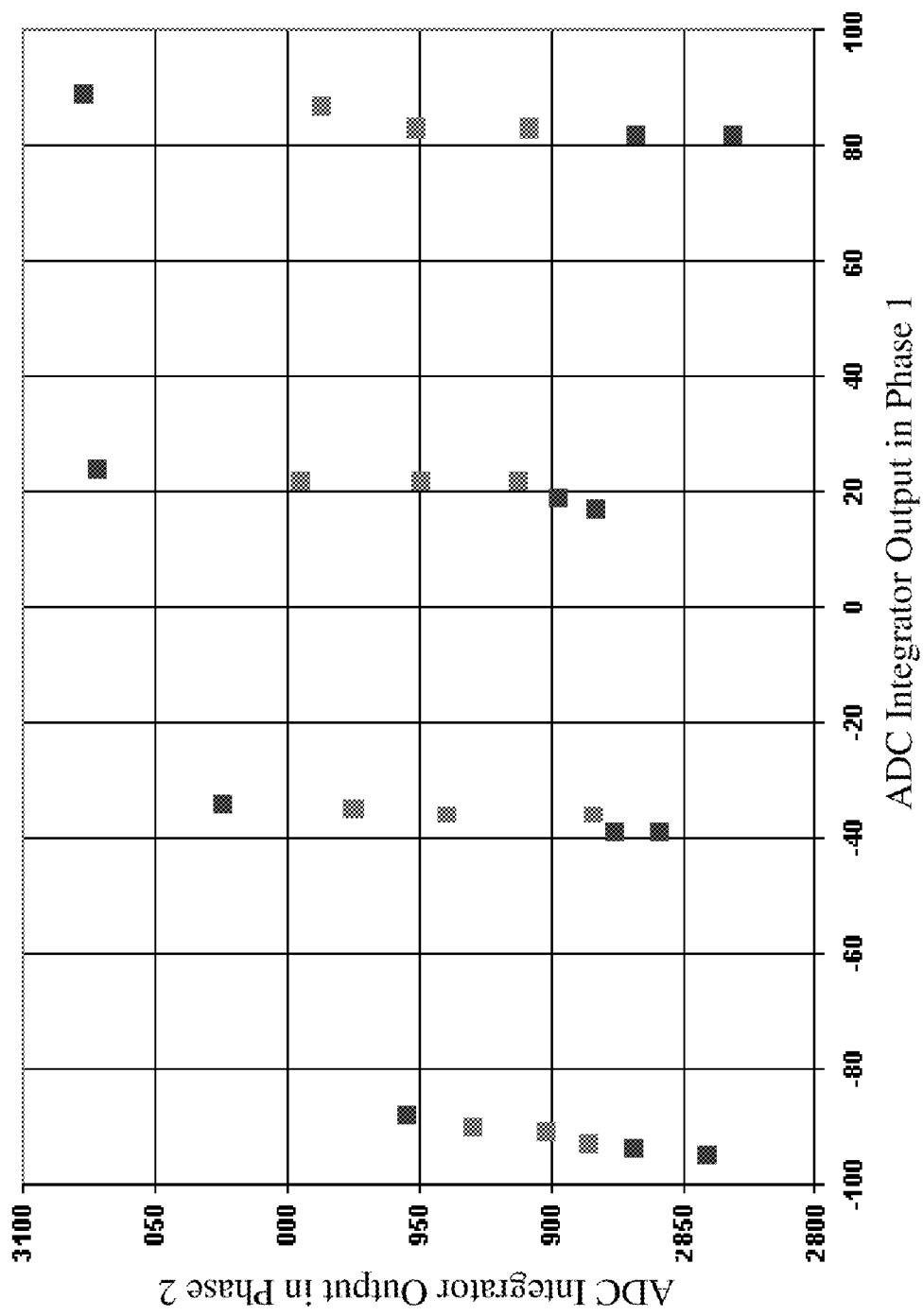
FIG. 14 graphically depicts a relationship between the ADC integrator outputs in first and second calibration phases for different timing mismatches between calibration and frequency synthesizer charge pumps after mismatch detection and cancellation in accordance with one embodiment of the invention.

FIG. 13 shows that the relationship between the ADC integrator outputs in the first and second phases may be linear for different timing mismatches between the two charge pumps. It may be possible, based on the value of the ADC integrator 910 in the first phase, to determine a correction factor for the ADC integrator 910 in the second phase to cancel the mismatch. The correction factor may be determined by using a second linear fitting of the form $y=M'_{slope} \cdot x + A'_{constant}$, where x is the value of the ADC integrator 910 in the first phase. The value y may then be subtracted from the value of the ADC integrator 910 in the second phase. These operations may be performed using the same existing digital fitting engine used in the first phase. In summary, the following operations are executed in the first and second phases:

$$Y_{phase\_1} = M_{slope\_phase\_1} \cdot X_{phase\_1} + A_{constant\_phase\_1} \quad (2)$$

$$Y_{phase\_2} = M_{slope\_phase\_2} \cdot (X_{phase\_2} - Y_{phase\_1}) + A_{constant\_phase\_2} \quad (3)$$

where $X_{phase\_1}$ is the ADC integrator 910 output in the first phase and $M_{slope\_phase\_1}$ and $A_{constant\_phase1}$ are the fitting parameters for the first-phase ADC integrator output. $A_{constant\_phase\_1}$ may be used to remove any timing mismatches between the frequency synthesizer and the calibration charge pumps. $X_{phase\_2}$ is the value of the difference between the current and the nominal ADC integrator outputs in the second phase and $M_{slope\_phase\_1}$ and $A_{constant\_phase\_1}$ are the corresponding fitting parameters. $Y_{phase\_2}$ is used to calibrate the frequency-synthesizer charge pump DAC according to the measured frequency synthesizer bandwidth. Using equations (2) and (3), the mismatch between the calibration and the frequency-synthesizer charge pumps may be eliminated, as shown in FIG. 14. The figure shows, in one embodiment, the ADC integrator value in the second phase, after the mismatch has been cancelled, for ±4% mismatch between the calibration and the frequency-synthesizer charge pumps. Although the ADC integrator output in the second phase may vary by approximately 200 LSBs, this translates to a maximum of 1 LSB in the charge-pump DAC setting that controls the bandwidth of the frequency synthesizer. In one embodiment, the integration time for the first phase (mismatch cancellation phase) and the second phase (bandwidth calibration phase) is made equal. In this case, the ADC integrator output obtained in the first phase may be directly subtracted from the ADC integrator output in the second phase, i.e., $M_{slope\_phase\_1}=1$ and $A_{constant\_phase\_1}=0$ in equation (2) above.

V. Integration Capacitor Calibration

Figure 15:
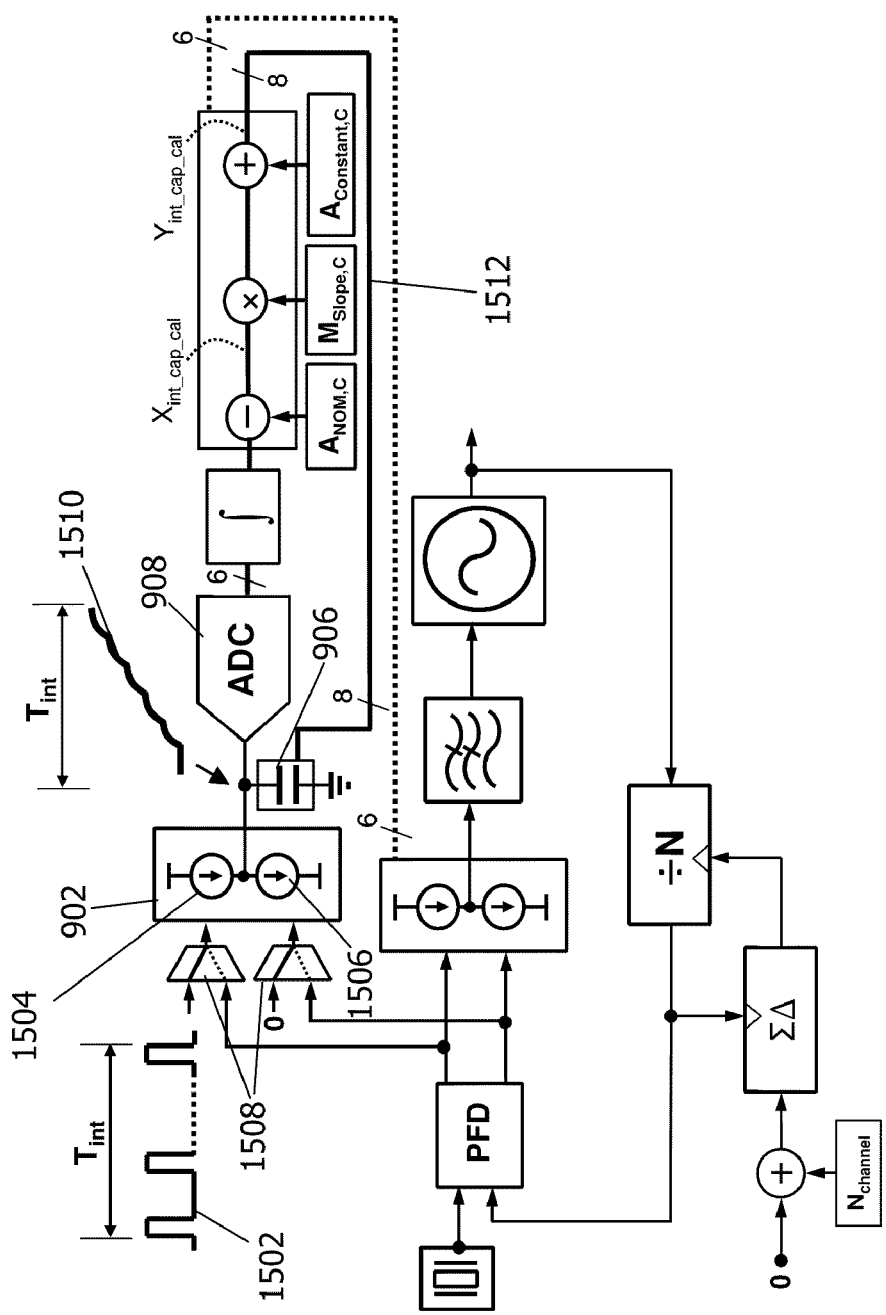
FIG. 15 schematically shows an integration capacitor calibration system in accordance with one embodiment of the invention.

Another source of inaccuracy in the calibration system is the variation in capacitance of the integration capacitor 906 due to, for example, process variations. In some embodiments, the integration capacitor value changes by as much as ±20%. This large variation may adversely affect the operation of the calibration system 900 and, therefore, must be detected and compensated for. FIG. 15 shows one embodiment of a calibration system 1500 that reuses the existing analog and digital hardware used in the overall calibration system 900.

The integration capacitor 906 may be calibrated using the calibration charge pump 902 as follows. A digital clock 1502 operating at, for example, 1 MHz and having a 10% duty cycle, is used as an input to the "up" current source 1504 of the calibration charge pump 902, while the input to the "down" current source 1506 is switched off. Multiplexers 1508 are used to switch the inputs of the calibration charge pump 902 between the frequency-synthesizer bandwidth calibration mode and the integration-capacitor calibration mode. The digital clock 1502 enables the "up" current source 1504 when the clock signal has a high level and disables the "up" current source 1504 when it has a low level. The capacitor 906 integrates the charge delivered by the calibration charge pump 902 and generates a voltage ramp 1510 having a slope representing the absolute value of the charge-pump current and the capacitor value. The absolute value of the charge-pump current is stabilized by using a bias current with a value is equal to $V_{bg}/R_{ext}$, where $V_{bg}$ is the on-chip bandgap reference voltage and $R_{ext}$ is the value of an external bias resistor. The voltage reference of the ADC 908 used in the calibration system is also $V_{bg}$, so the variation of the on-chip bandgap reference voltage does not significantly affect the calibration accuracy. The tolerance of $R_{ext}$ is desirably very low, e.g., on the order of 0.5%. Thus, the calibration charge-pump current may be very accurate and may not affect the capacitor calibration accuracy. The only parameter that significantly affects the ramp of the voltage integrated on the capacitor 906 is its capacitance.

Integration capacitor calibration is performed in the calibration circuit 1500 by enabling the digital clock 1502 to the calibration charge pump 902 for a predetermined amount of time ($T_{int}$). The voltage ramp 1510 on the capacitor 906 is digitized and integrated using the ADC 908 for a period of time equal to $T_{int}$. If the value of the capacitor 906 is nominal, the slope of the voltage ramp 1510 on the capacitor and the ADC integrator value are also nominal. Due to process variations, the capacitor value may be too high or too low, and, hence, the voltage ramp 1510 will be too low or too high, respectively. As a result, the ADC integrator value may be different from the nominal value. The difference between the ADC integrator value, measured at different process corners, and the nominal ADC integrator value is a measure of the deviation of the capacitor value with respect to its nominal value. This property may be used to calibrate the integration capacitor 906 to its nominal value by using a linear fitting operation given by the following equation:

$$Y_{int\_cap\_cal} = M_{slope,c} \cdot X_{int\_cap\_cal} + A_{constant,c} \quad (4)$$

where $X_{int\_cap\_cal}$ is the is the value of the difference between the current and the nominal ADC integrator outputs, $A_{nom,c}$, during the integrator capacitor calibration phase. $M_{slope,c}$ and $A_{constant,c}$ are the fitting parameters corresponding to the integration capacitor calibration as indicated in FIG. 15. $Y_{int\_cap\_cal}$ represents the digital output of the fitting operation and is used to calibrate the integration capacitor to a predetermined value. The integration capacitor may be implemented using a plurality of digitally selectable unit capacitors, for example, and an 8-bit digital word represented by $Y_{int\_cap\_cal}$ may be used to select the correct number of integration capacitor units via a feedback signal 1512.

Figure 16:
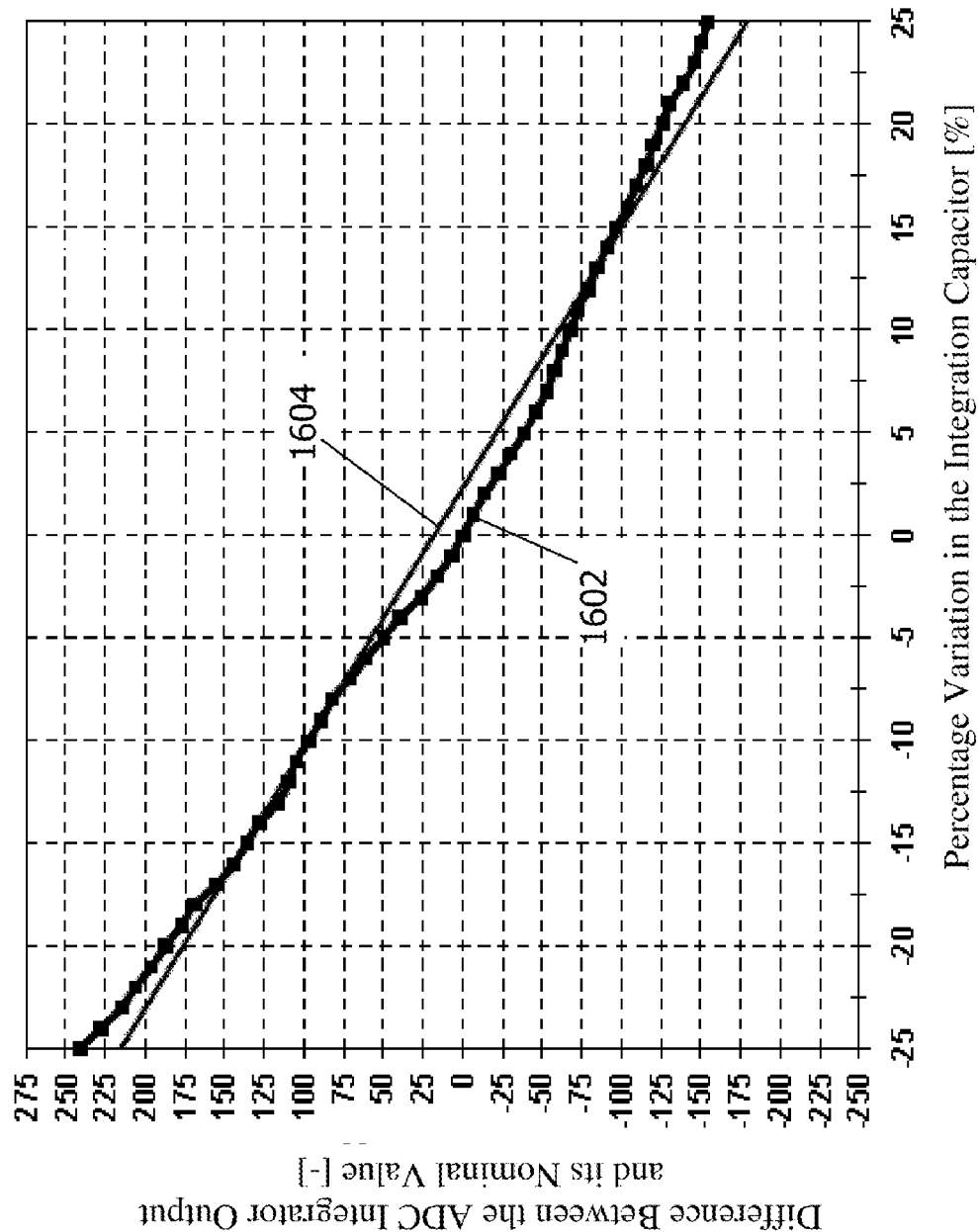
FIG. 16 graphically depicts an illustration of the integration capacitor calibration in accordance with one embodiment of the invention.

FIG. 16 representatively illustrates the calibration concept. The figure shows the difference 1602 between the ADC integrator output as the integration capacitor is varied by ±25% and the nominal ADC integrator value when the capacitor is at its nominal value. A linear fitting 1604 of this relationship is also shown. The deviation from linearity of the data 1602 may be caused by the partial saturation of the ADC integrator 910 when the capacitor 906 is much smaller than its nominal value, for example, when it is −25% of the nominal value. The partial saturation may be avoided by reducing the integration period ($T_{int}$) at the expense of the accuracy of the measurement of the deviation from the nominal value. Thus, there may be a tradeoff between the accuracy and the linearity of the measurement. Nevertheless, the nonlinearity observed in FIG. 16 may not substantially impact the calibration result, as shown in FIG. 17.

Figure 17:
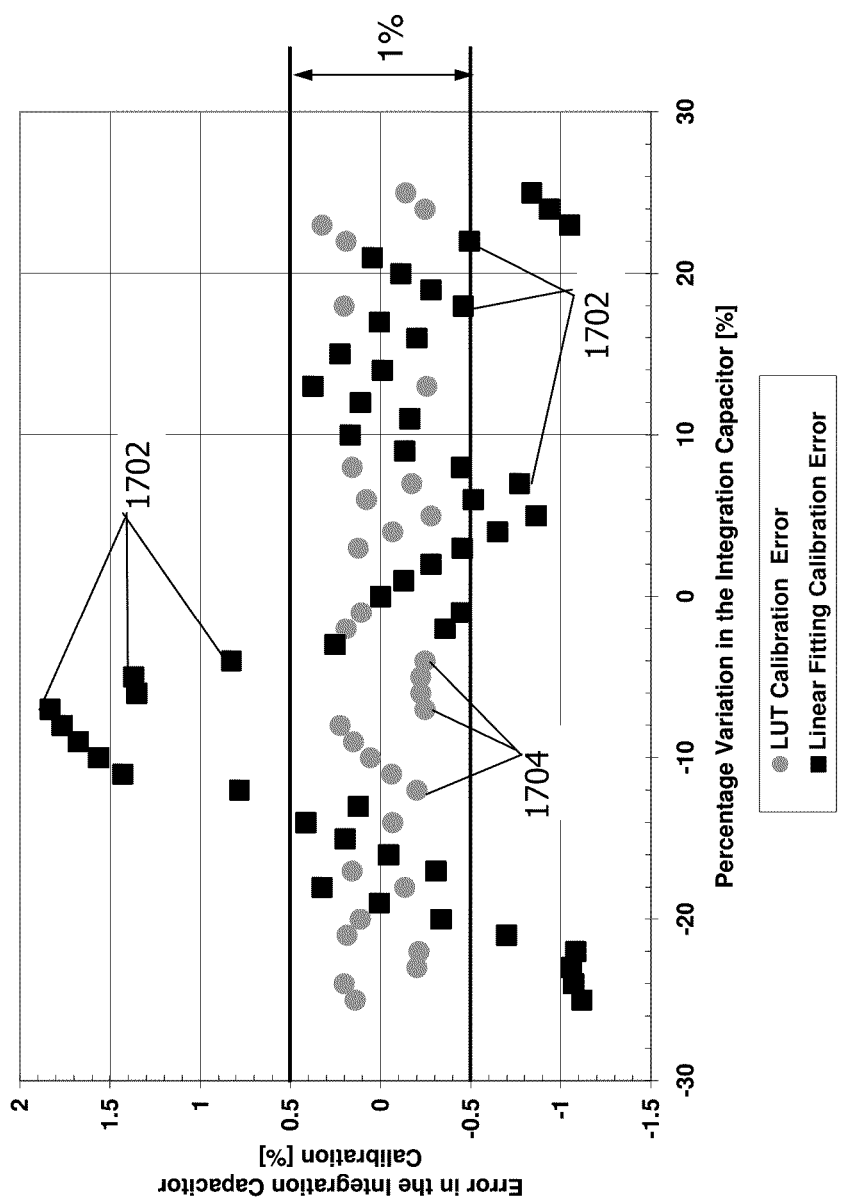
FIG. 17 graphically depicts errors in a value of a integration capacitor relative to a nominal capacitor value after calibration in accordance with one embodiment of the invention.

FIG. 17 shows the error in the value of the integration capacitor 906 relative to the nominal capacitor value, using the fitting parameters obtained from FIG. 16. In one embodiment, an calibration error 1702 of less than 2% is achieved for a variation of ±25% in the integration capacitor value. This error may be reduced, if needed, to less than ±0.5% if a look-up table (LUT) method, rather than a fitting method, is used to calibrate the capacitor, as shown by the points 1704.

Figure 18:
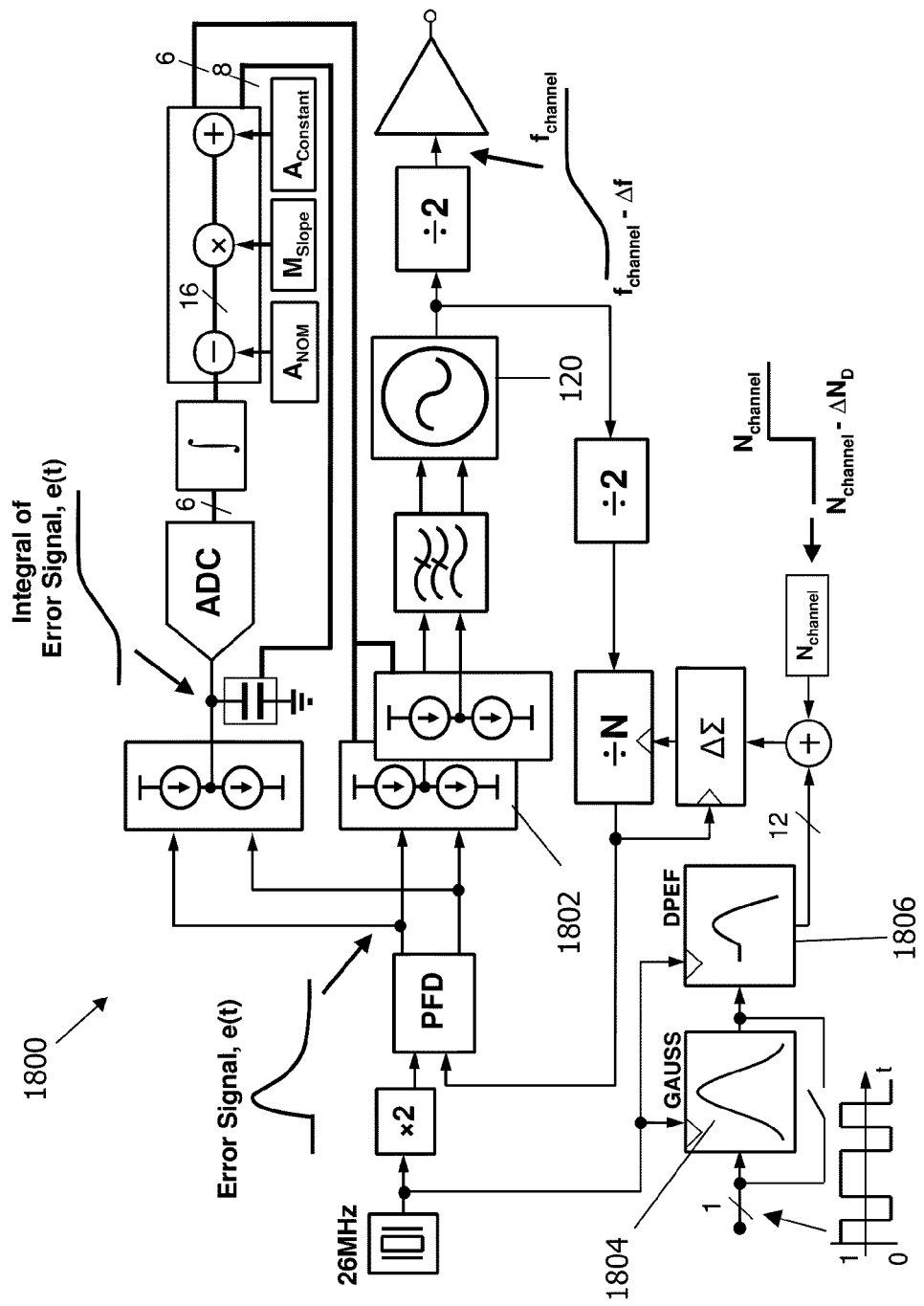
FIG. 18 schematically shows a frequency-synthesizer-based RF modulator having a on-chip loop filter in accordance with one embodiment of the invention.

FIG. 18 shows an embodiment of the invention wherein a frequency synthesizer 1800 having an on-chip loop filter is used as an RF modulator. The frequency synthesizer implements the on-chip loop filter using a dual charge pump 1802. The RF modulator may use a Gaussian filter 1804 to provide a Gaussian Minimum Shift Keying (GMSK) signal at the RF modulator output. A digital pre-emphasis filter 1806 may modify the input data to achieve data rates as high as 2 Mbps for GMSK signals. A 52 MHz clock frequency may be used to operate the frequency synthesizer to reduce the effect of the in-band quantization noise of the N-divider digital delta-sigma (ΔΣ) modulator on the root-mean-square (RMS) phase error of GMSK signals. In one embodiment, the digital pre-emphasis filter 1806 and the Gaussian filter 1804 operate at 26 MHz to reduce their power consumption. The voltage-controlled oscillator 120 may operate at twice the desired RF frequency to avoid pulling the transmitter power amplifier and then be divided down by two to generate the desired RF transmitter signal at the target RF frequency.

Figure 19:
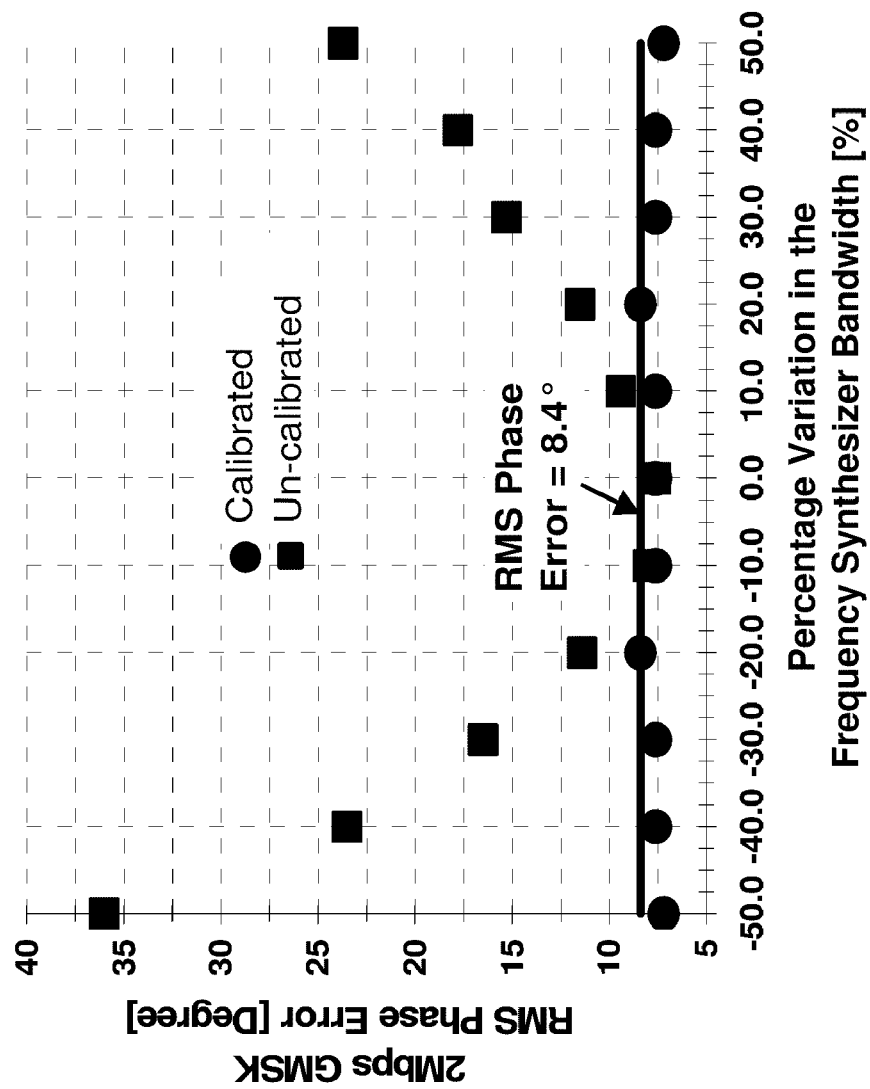
FIG. 19 graphically depicts a comparison between a calibrated and an un-calibrated RMS phase error of a GMSK signal in accordance with one embodiment of the invention.

FIG. 19 shows a comparison between the calibrated and the un-calibrated RMS phase error for a 2 Mbps GMSK signal when the frequency synthesizer bandwidth calibration system in accordance with embodiments of the present invention is used. After calibration, the RMS phase error improves from a worst-case of 30° to 8.5° (i.e., a 13 dB improvement). An RMS phase error of 8.5° is maintained in the presence of ±50% variation in the frequency synthesizer bandwidth.

Figure 20:
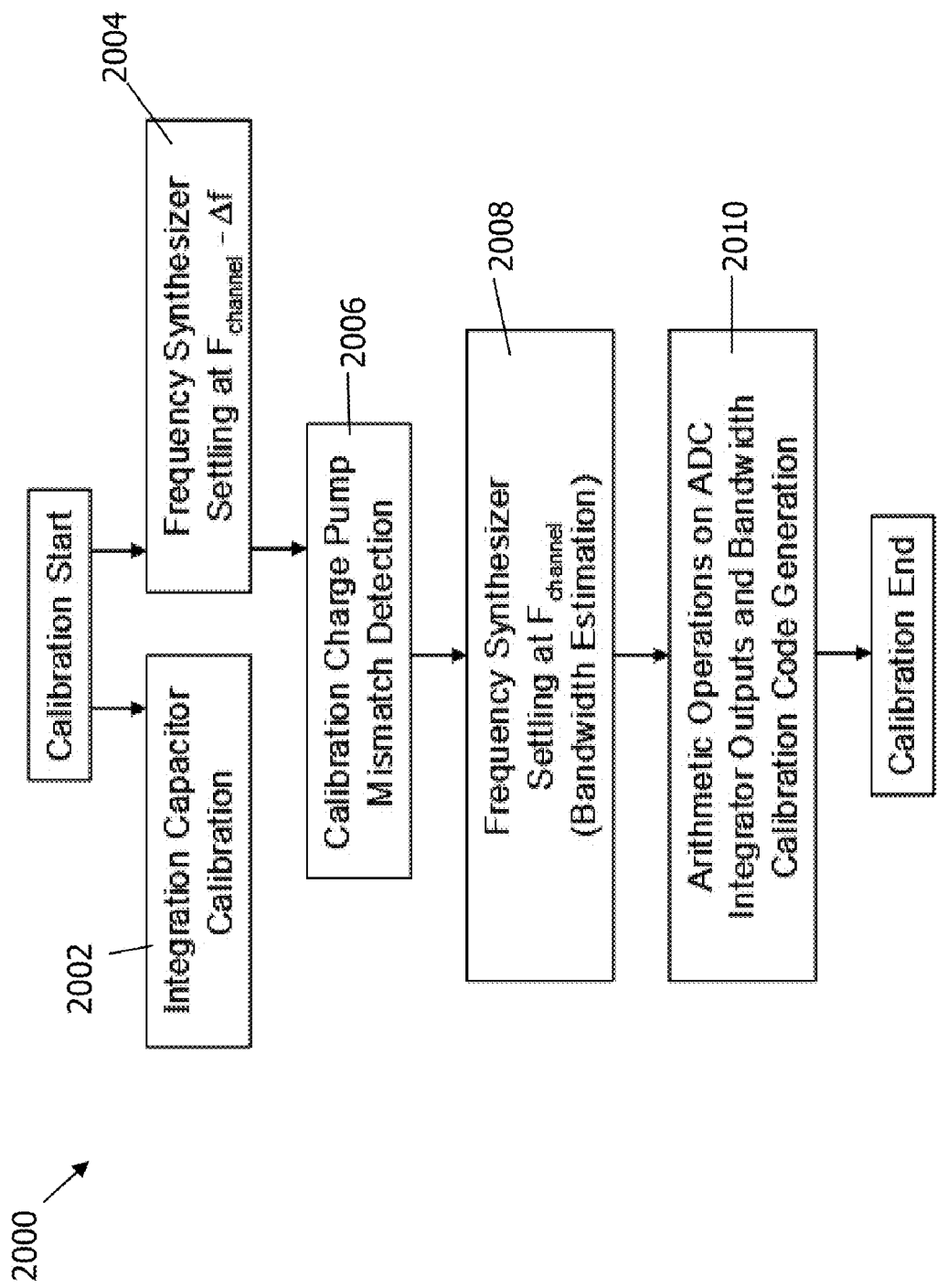
FIG. 20 is a flowchart showing a sequence for frequency synthesizer bandwidth calibration process events in accordance with one embodiment of the invention.

FIG. 20 illustrates a sequence 2000 for the bandwidth calibration process events. In the depicted sequence, the frequency synthesizer calibration begins with an integration capacitor calibration (Step 2002). In one embodiment, the frequency synthesizer is locked to a frequency difference of Δf below the desired channel, $f_{channel}$ while the integration capacitor is being calibrated (Step 2004). Next, the current mismatch between the calibration charge pump and the frequency-synthesizer charge pump is detected (Step 2006). Subsequently, a frequency step is then applied to the frequency synthesizer by removing the value of Δf from the frequency synthesizer frequency control (Step 2008). During the transient response of the frequency synthesizer, its bandwidth is estimated, as described earlier. The value of the ADC integrator obtained in this phase and the value obtained during the calibration charge-pump-mismatch-detection phase are used in an arithmetic operation given by equations (2) and (3) to generate a frequency synthesizer frequency-synthesizer charge pump DAC control word which is used to calibrate the bandwidth of the frequency synthesizer (Step 2010). In one embodiment, the overall calibration time is 70 µs.

In one embodiment, the calibration process 2000 is performed once when a frequency-synthesizer-based RF modulator is powered on. In an alternative embodiment, the calibration process is performed at regular intervals. The calibration process may also be performed selectively when the RF modulator is idle—i.e., not transmitting data—or at the beginning of each data transmission.

FIG. 21 illustrates one embodiment of a method 2100 for calibrating a PLL-based frequency synthesizer. The method begins by detecting an error signal generated by the PLL in response to a stimulus signal (Step 2102). Next, a difference is computed between the integral of the error signal and a nominal value thereof (Step 2104). The bandwidth is adjusted based on the computed difference (Step 2106)

Having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for calibrating a bandwidth of a phase-locked loop, the method comprising:
    detecting an error signal generated by the phase-locked loop in response to a stimulus signal;
    computing a difference between an integral of the error signal and a nominal value thereof; and
    adjusting the bandwidth based on the computed difference,
    wherein computing the integrated error signal comprises measuring a signal on an integration capacitor, and
    wherein the method further comprises:
    determining a capacitance of the integration capacitor; and
    adjusting the capacitance of the integration capacitor to a predetermined value.

2. The method of claim 1, wherein the predetermined value corresponds to the integration capacitor value in the absence of process variations.

3. The method of claim 1, wherein adjusting the capacitance of the integration capacitor comprises enabling at least one of a plurality of selectable capacitors.

4. The method of claim 1, wherein determining the capacitance of the integration capacitor comprises measuring a slope of a voltage on the integration capacitor and comparing the measured slope to a nominal slope.

5. The method of claim 4, wherein the voltage on the integration capacitor changes in response to an applied time-varying signal.

6. A system for calibrating a bandwidth of a phase-locked loop, the system comprising:
    error-detection circuitry for detecting an error signal generated by the phase-locked loop in response to an input signal;
    circuitry for computing a difference between an integral of the error signal and a nominal value thereof; and
    circuitry for adjusting a bandwidth of the phase-locked loop based on the computed difference, and
    an integrator for computing an integral of the detected error signal, wherein the integrator comprises an integration capacitor.

7. The system of claim 6, wherein the integration capacitor comprises an array of selectable capacitors.

8. The system of claim 6, further comprising a circuit for determining a capacitance of the integration capacitor and for adjusting the capacitance to a predetermined value.

\* \* \* \* \*